(12) United States Patent
Nidhi et al.

(10) Patent No.: US 12,148,757 B2
(45) Date of Patent: Nov. 19, 2024

(54) INTEGRATION OF SI-BASED TRANSISTORS WITH NON-SI TECHNOLOGIES BY SEMICONDUCTOR REGROWTH OVER AN INSULATOR MATERIAL

(71) Applicant: Intel Corporation, Santa Clara, CA (US)

(72) Inventors: Nidhi Nidhi, Hillsboro, OR (US); Han Wui Then, Portland, OR (US); Marko Radosavljevic, Portland, OR (US); Sansaptak Dasgupta, Hillsboro, OR (US); Paul B. Fischer, Portland, OR (US); Rahul Ramaswamy, Portland, OR (US); Walid M. Hafez, Portland, OR (US); Johann Christian Rode, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1367 days.

(21) Appl. No.: 16/390,478

(22) Filed: Apr. 22, 2019

(65) Prior Publication Data
US 2020/0335526 A1    Oct. 22, 2020

(51) Int. Cl.
| H01L 21/00 | (2006.01) |
| H01L 21/8258 | (2006.01) |
| H01L 27/092 | (2006.01) |
| H01L 27/12 | (2006.01) |
| H01L 29/778 | (2006.01) |

(52) U.S. Cl.
CPC ...... *H01L 27/1207* (2013.01); *H01L 21/8258* (2013.01); *H01L 27/092* (2013.01); *H01L 29/778* (2013.01)

(58) Field of Classification Search
CPC . H01L 27/107; H01L 21/8258; H01L 27/092; H01L 29/778
See application file for complete search history.

(56) References Cited

U.S. PATENT DOCUMENTS

| 5,166,084 A * | 11/1992 | Pfiester | H01L 21/30604 257/E21.415 |
| 5,591,653 A * | 1/1997 | Sameshima | H01L 29/66742 438/166 |
| 2004/0065884 A1 * | 4/2004 | Bhattacharyya | H01L 21/84 257/69 |
| 2005/0026339 A1 * | 2/2005 | Gonzalez | H01L 25/0657 257/E21.507 |

* cited by examiner

*Primary Examiner* — Richard A Booth
(74) *Attorney, Agent, or Firm* — Akona IP PC

(57) ABSTRACT

Disclosed herein are IC structures, packages, and devices that include Si-based semiconductor material stack monolithically integrated on the same support structure as non-Si transistors or other non-Si-based devices. In some aspects, the Si-based semiconductor material stack may be provided by semiconductor regrowth over an insulator material. Providing a Si-based semiconductor material stack monolithically integrated on the same support structure as non-Si based devices may provide a viable approach to integrating Si-based transistors with non-Si technologies because the Si-based semiconductor material stack may serve as a foundation for forming Si-based transistors.

20 Claims, 17 Drawing Sheets

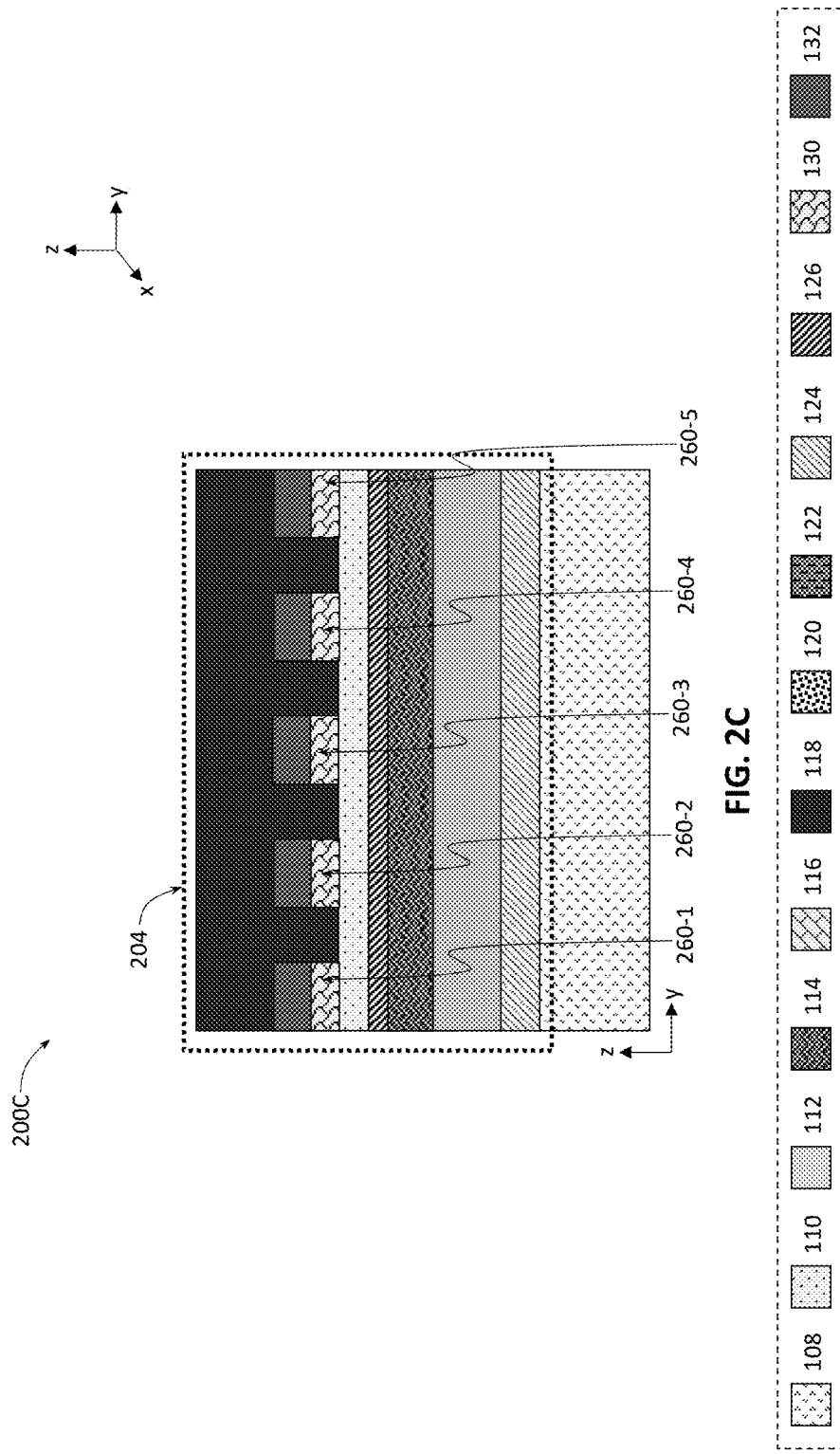

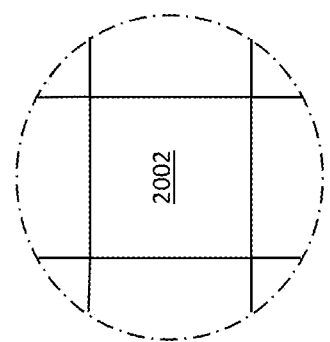
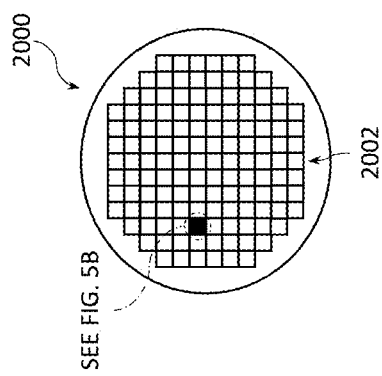
FIG. 5B
FIG. 5A

INTEGRATION OF SI-BASED TRANSISTORS WITH NON-SI TECHNOLOGIES BY SEMICONDUCTOR REGROWTH OVER AN INSULATOR MATERIAL

BACKGROUND

Solid-state devices that can be used in high-frequency and/or high voltage applications are of great importance in modern semiconductor technologies. For example, radio frequency (RF) integrated circuits (ICs) (RFICs) and power management integrated circuits (PMICs) may be critical functional blocks in system on a chip (SoC) implementations. Such SoC implementations may be found in mobile computing platforms such as smartphones, tablets, laptops, netbooks, and the like. In such implementations, the RFICs and PMICs are important factors for power efficiency and form factor, and can be equally or even more important than logic and memory circuits.

Transistor technologies based on semiconductor materials other than silicon (Si), may be particularly advantageous for high-frequency and high voltage applications. For example, III-N material based transistors such as gallium nitride (GaN) transistors are being extensively evaluated as an alternative to Si-based transistors due, in part, to the large band gap and high mobility of some III-N materials.

Despite the advantages, there are some challenges associated with III-N and other non-Si based transistors that may hinder their large-scale implementation. One such challenge resides in the absence of a commercially viable complementary metal-oxide-semiconductor (CMOS) capability of many non-Si technologies. For example, it is very challenging to fabricate P-type metal-oxide-semiconductor (PMOS) transistors of sufficiently low voltage (e.g., below about 5 volts) using III-N materials. Therefore, conventional III-N ICs are limited to using N-type metal-oxide-semiconductor (NMOS) transistors only. The standby current and good logic performance of such ICs are extremely challenging. In addition, since various devices require CMOS circuits that use both PMOS and NMOS transistors, PMOS transistors have to be implemented on a chip separate from that housing the III-N ICs, e.g., as conventional silicon front end of line (FEOL) transistors on a chip separate from the III-N chip. A chip with PMOS silicon FEOL transistors and a chip with III-N transistors can then be connected with input/output (I/O) pins, in a multi-chip package (MCP). While such a solution may be acceptable for a small number of I/O pins, as logic solutions increase in complexity, the number of required I/O pins between the NMOS and PMOS chips increases as well, compromising the viability of this solution.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 2C provides a cross-sectional side view illustrating a third example of an IC structure with fins formed from a Si-based semiconductor material stack provided by semiconductor regrowth over an insulator material, according to some embodiments of the present disclosure.

FIGS. 5A-5B are top views of a wafer and dies that include one or more IC structures having one or more Si-based devices integrated with one or more non-Si technology devices by semiconductor regrowth over an insulator material in accordance with any of the embodiments of the present disclosure.

DETAILED DESCRIPTION

Overview

Figure 1:
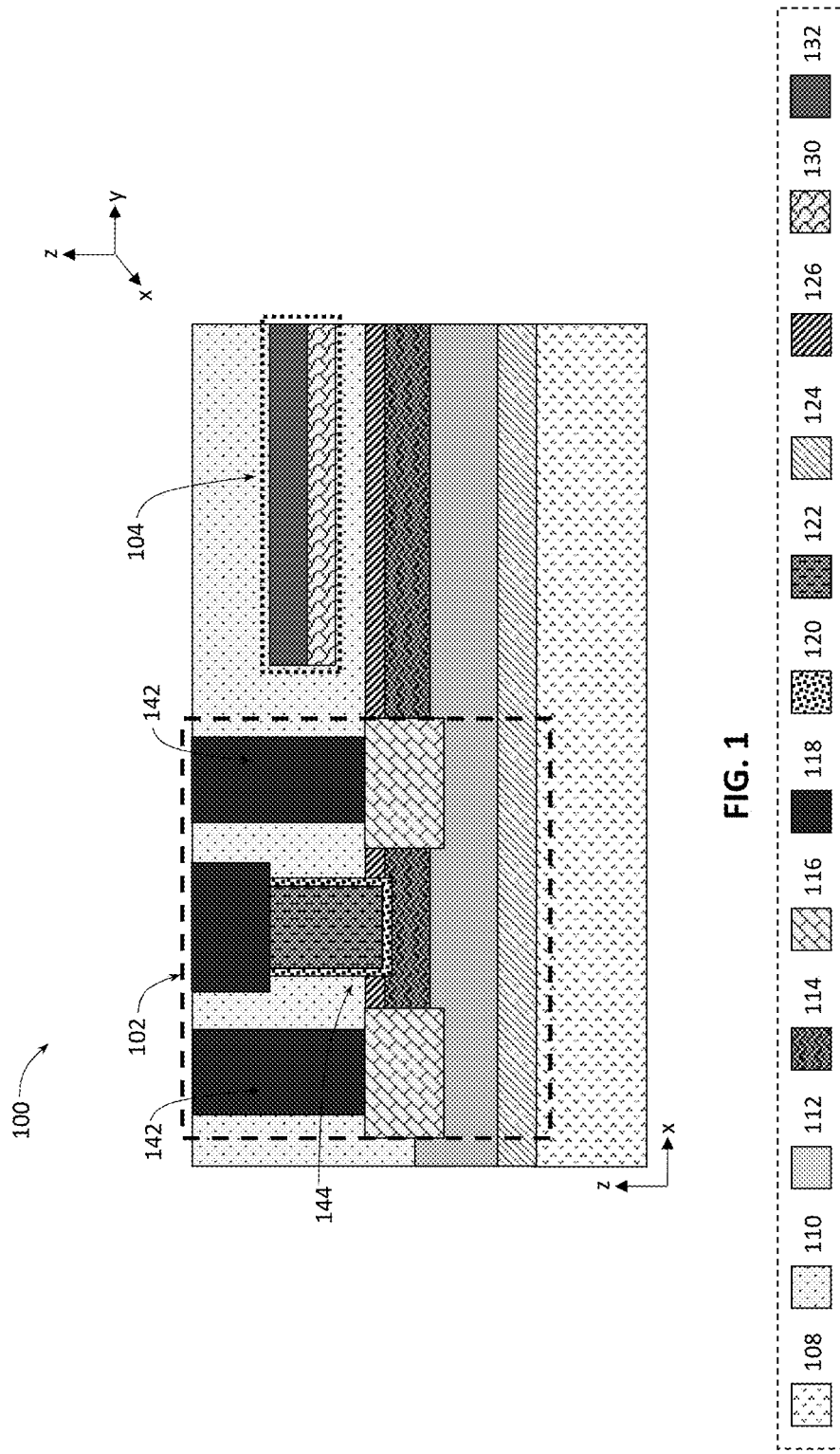
FIG. 1 provides a cross-sectional side view illustrating an IC structure that includes an example non-Si transistor integrated with a Si-based semiconductor material stack provided by semiconductor regrowth over an insulator material, according to some embodiments of the present disclosure.

As mentioned above, transistors based on some non-Si semiconductor materials, such as III-N semiconductor materials (e.g., III-N transistors), have properties that make them particularly advantageous for certain applications.

For example, because GaN has a larger band gap (about 3.4 electron-volts (eV)) than Si (band gap of about 1.1 eV), a GaN transistor is expected to withstand a larger electric field (resulting, e.g., from applying a large voltage to the drain, Vdd) before suffering breakdown, compared to a Si transistor of similar dimensions. Furthermore, III-N transistors may advantageously employ a 2D electron gas (2DEG) (i.e., a group of electrons, an electron gas, free to move in two dimensions but tightly confined in the third dimension, e.g., a 2D sheet charge) as its transport channel, enabling high mobility without relying on using impurity dopants. For example, the 2DEG may be formed just below a heterojunction interface formed by deposition (e.g., epitaxial deposition), on a given III-N semiconductor material, of a charge-inducing film of a material having larger spontaneous and piezoelectric polarization, compared to the III-N semiconductor material. Such a film is generally referred to as a "polarization material" while the III-N semiconductor material adjacent to the polarization material may be referred to as a "III-N channel material" because this is where a conductive channel (2DEG) is formed during operation of the III-N transistor. Together, a stack of a III-N channel material and a polarization material provided thereon may be referred to as a "III-N channel stack" of a III-N transistor. Providing a polarization material such as AlGaN over a III-N channel material such as GaN may induce tensile strain in the polarization material (e.g., due to the lattice mismatch between these two materials; e.g., due to the lattice constant of a polarization material such as AlGaN being smaller than that of the III-N semiconductor material such as GaN), which allows forming very high charge densities in the underlying III-N channel material without intentionally adding impurity dopants. As a result, high mobility of charge carriers in the III-N channel material may, advantageously, be realized.

As used herein, the term "III-N semiconductor material" (or, simply, "III-N material") refers to a compound semiconductor material with a first sub-lattice of at least one element from group III of the periodic table (e.g., Al, Ga, In) and a second sub-lattice of nitrogen (N). As used herein, the term "III-N transistor" refers to a field-effect transistor (FET) that includes a III-N material (which may include one or more different III-N materials, e.g., a plurality of different III-N materials stacked over one another) as an active material (i.e., the material in which a conducting channel of the transistor forms during operation, in which context the III-N material may also be referred to as a "III-N channel material").

While discussions provided herein refer to the two-dimensional charge carrier layers as "2DEG" layers, embodiments described herein are also applicable to systems and material combinations in which 2D hole gas (2DHG) may be formed, instead of 2DEG. Thus, unless stated otherwise, explanations of embodiments referring to 2DEG may be applied to transistors implementing 2DHG instead, all of such embodiments being within the scope of the present disclosure.

As described above, despite the advantages, there are some challenges associated with III-N transistors that may hinder their large-scale implementation, such as the absence of viable low voltage PMOS transistors that can be built using III-N materials.

Disclosed herein are IC structures, packages, and device assemblies that include Si-based semiconductor material stack monolithically integrated on the same support structure/material (which may be, e.g., a substrate, a die, or a chip) as non-Si transistors or other non-Si-based devices. In some aspects, the Si-based semiconductor material stack may be provided by a fabrication technique that may be referred to as "semiconductor regrowth over an insulator material." Embodiments of the present disclosure are based on recognition that providing a Si-based semiconductor material stack monolithically integrated on the same support structure as non-Si transistors may provide a viable approach to integrating Si-based transistors with non-Si technologies. In particular, the Si-based semiconductor material stack may serve as a foundation for forming Si-based transistors (i.e., one or more Si-based transistors may be formed with one or more portions of the Si-based semiconductor material stack forming at least some portions of these transistors, e.g., forming channel regions of these transistors). For example, in some implementations, providing Si-based semiconductor material stack may enable providing PMOS transistors on the same support structure with NMOS transistors. In various embodiments, the NMOS transistors may, e.g., be III-N transistors or non-III-N transistors (e.g., NMOS thin-film transistors (TFTs), SiGe transistors, III-V transistors, etc.). In this manner, an integrated logic solution may be provided based on any suitable transistor technology (e.g., III-N transistor technology, Si, SiGe, or Ge transistor technology, III-V transistor technology, etc.). For example, in some embodiments of the present disclosure, a Si-based transistor formed using the Si-based semiconductor material stack may be integrated with a non-Si transistor, e.g., a III-N transistor, by being disposed side-by-side with the non-Si transistor, advantageously enabling implementation of both types of transistors in a single device layer. In other embodiments, a Si-based transistor may be integrated by being disposed above or below a non-Si transistor, i.e., in a different device layer, which may be advantageous in terms of a smaller x-y footprint.

In general, Si-based transistors fabricated using a semiconductor material stack provided by semiconductor regrowth over an insulator material as described herein are referred to as "Si-based" because the semiconductor material stack includes polysilicon. However, in various embodiments, in addition to a layer of polysilicon, such Si-based transistors may also advantageously employ other semiconductor materials, e.g., group IV semiconductor materials, such as germanium (Ge), or alloys of materials, such as silicon germanium (SiGe).

While some embodiments described herein refer to III-N transistors (i.e., transistors employing one or more III-N materials as an active channel material), these embodiments are equally applicable to any other III-N devices besides III-N transistors, such as III-N diodes, sensors, light-emitting diodes (LEDs), and lasers (i.e., other device components employing one or more III-N materials as active materials). In general, while some embodiments of the present disclosure refer to integration of Si-based transistors with III-N transistors, these embodiments are equally applicable to non-Si based transistors other than III-N transistors and to non-Si technologies (i.e., technologies utilizing semiconductor materials other than Si) other than transistors, e.g., various other HEMTs, HBTs, SiGe transistors, or various III-V devices.

Because non-Si transistors and Si-based transistors fabricated using a semiconductor material stack provided by semiconductor regrowth over an insulator material as described herein are both provided over a single support structure, they may be referred to as "integrated" transistors. In this manner, one or more Si-based transistors (or other Si-based devices) may, advantageously, be integrated with one or more non-Si technology transistors (or other non-Si devices) by semiconductor regrowth over an insulator material, enabling monolithic integration of these different types of semiconductor materials. For example, such integration may enable fabrication of PMOS transistors, which may be provided by at least some of the Si-based transistors, on a single chip with NMOS transistors, which may be provided by at least some of the III-N transistors. In another example, both PMOS and NMOS transistors of a given CMOS circuit may be implemented as any of the Si-based transistors as descried herein, enabling monolithic integration of CMOS circuits with non-Si based transistors (e.g., III-N transistors) and/or enabling monolithic integration of Si NMOS and SiGe PMOS transistors on a single support structure. Various integration schemes described herein may reduce costs and improve performance, e.g., by reducing RF losses incurred when power is routed off chip in an MCP. Side-by-side arrangement of non-Si transistors and Si-based transistors may provide a further advantage of the ability to share at least some of the fabrication processes used to manufacture these transistors (i.e., the ability to use a single fabrication process to form a portion of a non-Si transistor and a portion of a Si-based transistor).

Each of the structures, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc. Similarly, the terms naming various compounds refer to materials having any combination of the individual elements within a compound (e.g., "gallium nitride" or "GaN" refers to a material that includes gallium and nitrogen, "aluminum indium gallium nitride" or "AlInGaN" refers to a material that includes aluminum, indium, gallium and nitrogen, and so on). Further, the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 5A-5B, such a collection may be referred to herein without the letters, e.g., as "FIG. 5." In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

In the drawings, some schematic illustrations of example structures of various structures, devices, and assemblies described herein may be shown with precise right angles and straight lines, but it is to be understood that such schematic illustrations may not reflect real-life process limitations that may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC structures that include at least one non-Si device (e.g., a III-N transistor) integrated with at least one Si-based device (e.g., a Si-based transistor) fabricated using a Si-based semiconductor material stack provided by semiconductor regrowth over an insulator material over a single support structure as described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on an IC, provided as an integral part of an IC, or those connected to an IC. The IC may be either analog or digital and may be used in a number of applications, such as microprocessors, optoelectronics, logic blocks, audio amplifiers, etc., depending on the components associated with the IC. In some embodiments, IC structures as described herein may be included in a RFIC, which may, e.g., be included in any component associated with an IC of an RF receiver, an RF transmitter, or an RF transceiver, e.g., as used in telecommunications within base stations (BS) or user equipment (UE). Such components may include, but are not limited to, power amplifiers, low-noise amplifiers, RF filters (including arrays of RF filters, or RF filter banks), switches, upconverters, downconverters, and duplexers. In some embodiments, the IC structures as described herein may be employed as part of a chipset for executing one or more related functions in a computer.

Integrating a Si-Based Semiconductor Material Stack with a Non-Si Device

Figure 2A:
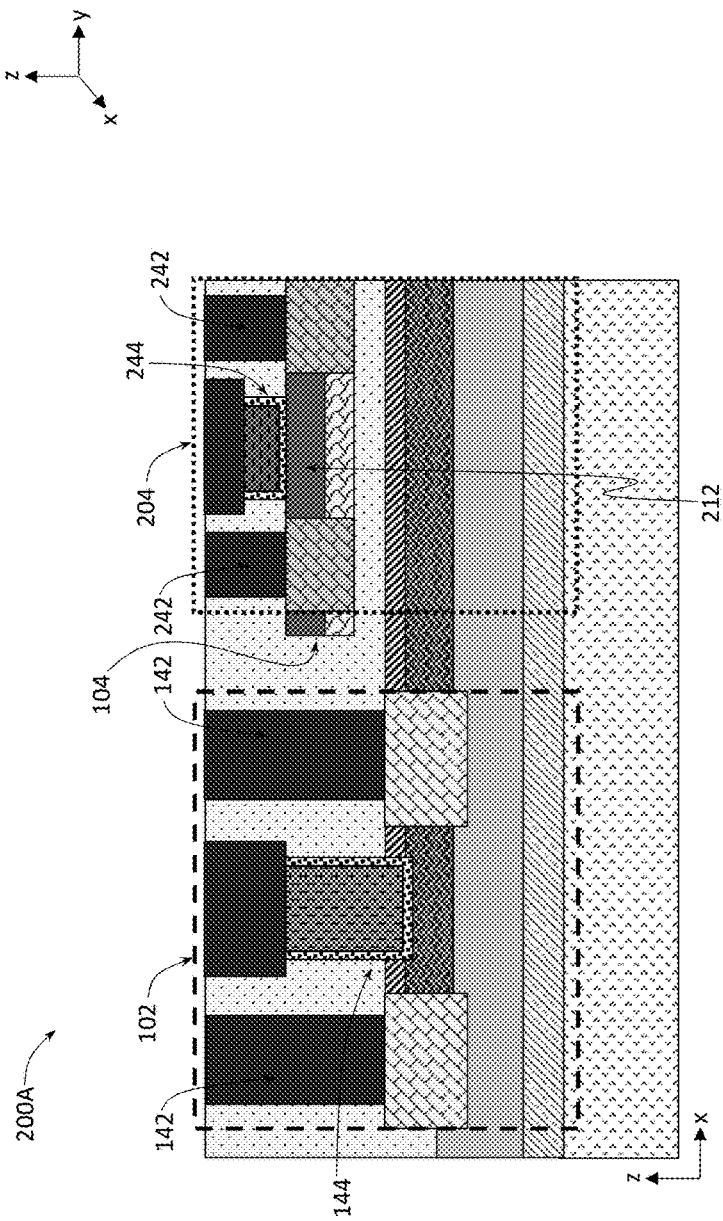
FIG. 2A provides a cross-sectional side view illustrating a first example of an IC structure with a Si-based transistor fabricated using a Si-based semiconductor material stack provided by semiconductor regrowth over an insulator material, according to some embodiments of the present disclosure.

FIG. 1 provides a cross-sectional side view illustrating an IC structure 100 that includes an example non-Si transistor integrated with a Si-based semiconductor material stack provided by semiconductor regrowth over an insulator material, according to some embodiments of the present disclosure. In FIG. 1, the example non-Si transistor is shown as a III-N transistor 102, an approximate boundary of which is illustrated in FIG. 1 with a thick dashed line, integrated with a Si-based semiconductor material stack 104, an approximate boundary of which is illustrated in FIG. 1 with a thick dotted line. A legend provided within a dashed box at the bottom of FIG. 1 illustrates colors/patterns used to indicate some classes of materials of some of the elements shown in FIG. 1, so that FIG. 1 is not cluttered by too many reference numerals. For example, FIG. 1 uses different colors/patterns to identify a support structure 108, an insulator 110, a III-N material 112, a polarization material 114, source/drain (S/D) regions 116 of the III-N transistor 102, an electrically conductive material 118 used to implement contacts to various transistor terminals, a gate dielectric material 120, a gate electrode material 122, a buffer material 124, a hardmask material 126, a base semiconductor material 130 and a channel semiconductor material 132 of the Si-based semiconductor material stack 104. The Si-based semiconductor material stack 104 may be provided by semiconductor regrowth over the insulator material 110 and may be used to form one or more Si-based transistors integrated with the III-N transistor 102 (or any other non-Si device) in accordance with various embodiments described herein, some of which are shown in FIGS. 2A-2C.

The support structure 108 may be any suitable structure, e.g., a substrate, a die, or a chip, on which Si-based transistors and non-Si transistors or other devices as described herein may be implemented. In some embodiments, the support structure 108 may include a semiconductor, such as silicon. In other implementations, the support structure 108 may include/be alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N or group IV materials.

In some embodiments, the support structure 108 may include a ceramic material, or any other non-semiconductor material. For example, in some embodiments, the support structure 108 may include glass, a combination of organic and inorganic materials, embedded portions having different materials, etc. Although a few examples of materials from which the support structure 108 may be formed are described here, any material that may serve as a foundation upon which at least one Si-based transistor and at least one non-Si transistor or another non-Si device as described herein may be built falls within the spirit and scope of the present disclosure.

Although not specifically shown in FIG. 1, in some embodiments, the support structure 108 of the IC structure 100 may include an insulating layer, such as an oxide isolation layer, provided thereon. For example, in some embodiments, a layer of the insulator 110 may be provided over the support structure 108 (not shown in FIG. 1). The insulator 110 may include any suitable insulating material, e.g., any suitable interlayer dielectric (ILD), to electrically isolate the semiconductor material of the support structure 108 from other regions of or surrounding the III-N transistor 102 and/or from other regions of or surrounding the Si-based semiconductor material stack 104. Providing such an insulating layer over the support structure 108 may help mitigate the likelihood that conductive pathways will form through the support structure 108 (e.g., a conductive pathway between the S/D regions 116). Examples of the insulator 110 may include, in some embodiments, silicon oxide, silicon nitride, aluminum oxide, and/or silicon oxynitride. In general, the insulator 110 may be provided in various portions of the IC structure 100. In some embodiments, the insulator 110 may include a continuous insulator material encompassing at least portions of the III-N transistor 102 as well as at least portions of the Si-based semiconductor material stack 104. In various embodiments, the insulator 110 may include different insulating materials in different portions of the IC structure 100.

In some embodiments, the III-N material 112 may be formed of a compound semiconductor with a first sub-lattice of at least one element from group III of the periodic table (e.g., Al, Ga, In), and a second sub-lattice of nitrogen (N). In some embodiments, the III-N material 112 may be a binary, ternary, or quaternary III-N compound semiconductor that is an alloy of two, three, or even four elements from group III of the periodic table (e.g., boron, aluminum, indium, gallium) and nitrogen.

In general, the III-N material 112 may be composed of various III-N semiconductor material systems including, for example, N-type or P-type III-N materials systems, depending on whether the III-N transistor 102 is an N-type or a P-type transistor. For some N-type transistor embodiments, the III-N material 112 may advantageously be a III-N material having a high electron mobility, such as, but not limited to GaN. In some such embodiments, the III-N material 112 may be a ternary III-N alloy, such as InGaN, or a quaternary III-N alloy, such as AlInGaN.

In some embodiments, the III-N material 112 may be formed of a highly crystalline semiconductor, e.g., of substantially a monocrystalline semiconductor (possibly with some limited amount of defects, e.g., dislocations). The quality of the III-N material 112 (e.g., in terms of defects or crystallinity) may be higher than that of other III-N materials of, or near, the III-N transistor 102 since, during the operation of the III-N transistor 102, a transistor channel will form in the III-N material 112. A portion of the III-N material 112 where a transistor channel of the III-N transistor 102 forms during operation may be referred to as a "III-N channel material/region" of the III-N transistor 102.

In some embodiments, the III-N material 112 may be an intrinsic III-N semiconductor material or alloy, not intentionally doped with any electrically active impurity. In alternate embodiments, one or more a nominal impurity dopant level may be present within the III-N material 112, for example to set a threshold voltage Vt of the III-N transistor 102, or to provide halo pocket implants, etc. In such impurity-doped embodiments however, impurity dopant level within the III-N material 112 may be relatively low, for example below $10^{15}$ dopant atoms per cubic centimeter (#/cm$^3$ or, simply, cm$^{-3}$), or below $10^{13}$ cm$^{-3}$.

In various embodiments, a thickness of the III-N material 112 may be between about 5 and 2000 nanometers, including all values and ranges therein, e.g., between about 50 and 1000 nanometers, or between about 10 and 50 nanometers. Unless specified otherwise, all thicknesses described herein refer to a dimension measured in a direction perpendicular to the support structure 108.

Turning now to the polarization material 114 of the III-N transistor 102, in general, the polarization material 114 may be a layer of a charge-inducing film of a material having larger spontaneous and/or piezoelectric polarization than that of the bulk of the III-N layer material immediately below it (e.g., the III-N material 112), creating a heterojunction (i.e., an interface that occurs between two layers or regions of semiconductors having unequal band gaps) with the III-N material 112, and leading to formation of 2DEG at or near (e.g., immediately below) that interface, during operation of the III-N transistor 102. As described above, a 2DEG layer may be formed during operation of a III-N transistor in a layer of a III-N semiconductor material immediately below a suitable polarization layer. In various embodiments, the polarization material 114 may include materials such as AlN, InAlN, AlGaN, or $Al_xIn_yGa_{1-x-y}N$, and may have a thickness between about 1 and 50 nanometers, including all values and ranges therein, e.g., between about 5 and 15 nanometers or between about 10 and 30 nanometers. In some embodiments, the polarization material 114 may include any suitable semiconductor material having a lattice constant smaller than that of the III-N material 112.

As also shown in FIG. 1, the III-N transistor 102 may include two S/D regions 116, where one of the S/D regions 116 is a source region and another one is a drain region, where the "source" and the "drain" designations may be interchangeable. As is well-known, in a transistor, S/D regions (also sometimes interchangeably referred to as "diffusion regions") are regions that can supply charge carriers for the transistor channel (e.g., the transistor channel 112) of the transistor (e.g., the III-N transistor 102). In some embodiments, the S/D regions 116 may include highly doped semiconductor materials, such as highly doped InGaN. Often, the S/D regions may be highly doped, e.g., with dopant concentrations of at least above $1 \times 10^{21}$ cm$^{-3}$, in order to advantageously form Ohmic contacts with the respective S/D electrodes of the III-N transistor 102 (e.g., electrodes 142 shown in FIG. 1, made of the electrically conductive material 118), although these regions may also have lower dopant concentrations in some implementations. Regardless of the exact doping levels, the S/D regions 116 are the regions having dopant concentration higher than in other regions between the source region (e.g., the S/D region 116 shown on the left side in FIG. 1) and the drain region (e.g., the S/D region 116 shown on the right side in FIG. 1), i.e., higher than the III-N material 112. For that reason, sometimes the S/D regions are referred to as highly doped (HD) S/D regions. In further embodiments, one or more layers of metal and/or metal alloys may be used to form the S/D regions 116.

The electrically conductive material 118 of the S/D electrodes 142 may include any suitable electrically conductive material, alloy, or a stack of multiple electrically conductive materials. In some embodiments, the electrically conductive material 118 may include one or more metals or metal alloys, with metals such as copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, the electrically conductive material 118 may include one or more electrically conductive alloys, oxides, or carbides of one or more metals. In some embodiments, the electrically conductive material 118 may include a doped semiconductor, such as silicon or another semiconductor doped with an N-type dopant or a P-type dopant. Metals may provide higher conductivity, while doped semiconductors may be easier to pattern during fabrication. In some embodiments, the S/D electrodes 142 may have a thickness between about 2 nanometers and 1000 nanometers, preferably between about 2 nanometers and 100 nanometers. FIG. 1 further illustrates that the electrically conductive material 118 may also be used to form electrical contact to the gate electrode of the III-N transistor 102 (i.e., in general, the electrically conductive material 118 may also be used to form electrical contacts to any of the transistor terminals of the III-N transistor 102), while FIGS. 2A-2C illustrate that the electrically conductive material 118 may also be used to form electrical contacts to any of the transistor terminals of one or more transistors formed from the Si-based semiconductor material stack 104. In various embodiments, the exact material compositions of the electrically conductive material 118 may be different when used to implement contacts to different electrodes of different transistors within the IC structure 100.

FIG. 1 further illustrates a gate stack 144 provided over the channel portion of the III-N material 112. The gate stack 144 may include a layer of a gate dielectric material 120, and a gate electrode material 122.

The gate dielectric material 120 is typically a high-k dielectric material, e.g., a material including elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric material 120 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric material 120 during manufacture of the III-N transistor 102 to improve the quality of the gate dielectric material 120. A thickness of the gate dielectric material 120 may be between 0.5 nanometers and 3 nanometers, including all values and ranges therein, e.g., between 1 and 3 nanometers, or between 1 and 2 nanometers.

The gate electrode material 122 may include at least one P-type work function metal or N-type work function metal, depending on whether the III-N transistor 102 is a PMOS transistor or an NMOS transistor (e.g., P-type work function metal may be used as the gate electrode material 122 when the transistors 102 is a PMOS transistor and N-type work function metal may be used as the gate electrode material 122 when the III-N transistor 102 is an NMOS transistor, depending on the desired threshold voltage). For a PMOS transistor, metals that may be used for the gate electrode material 122 may include, but are not limited to, ruthenium, palladium, platinum, cobalt, nickel, titanium nitride, and conductive metal oxides (e.g., ruthenium oxide). For an NMOS transistor, metals that may be used for the gate electrode material 122 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and nitrides of these metals (e.g., tantalum nitride, and tantalum aluminum nitride). In some embodiments, the gate electrode material 122 may include a stack of two or more metal layers, where one or more metal layers are work function metal layers and at least one metal layer is a fill metal layer.

Further layers may be included next to the gate electrode material 122 for other purposes, such as to act as a diffusion barrier layer or/and an adhesion layer, not specifically shown in FIG. 1. Furthermore, in some embodiments, the gate dielectric material 120 and the gate electrode material 122 may be surrounded by a gate spacer, not shown in FIG. 1, configured to provide separation between the gates of different transistors. Such a gate spacer may be made of a low-k dielectric material (i.e., a dielectric material that has a lower dielectric constant (k) than silicon dioxide, which has a dielectric constant of 3.9). Examples of low-k materials that may be used as the dielectric gate spacer may include, but are not limited to, fluorine-doped silicon dioxide, carbon-doped silicon dioxide, spin-on organic polymeric dielectrics such as polyimide, polynorbornenes, benzocyclobutene, and polytetrafluoroethylene (PTFE), or spin-on silicon-based polymeric dielectric such as hydrogen silsesquioxane (HSQ) and methylsilsesquioxane (MSQ)). Other examples of low-k materials that may be used as the dielectric gate spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

In some embodiments, the IC structure 100 may, optionally, include a buffer material 124 between the III-N material 112 and the support structure 108, as shown in FIG. 1. In some embodiments, the buffer material 124 may be a layer of a semiconductor material that has a band gap larger than that of the III-N material 112, so that the buffer material 124 can serve to prevent current leakage from the future III-N transistor to the support structure 108. A properly selected semiconductor for the buffer material 124 may also enable better epitaxy of the III-N material 112 thereon, e.g., it may improve epitaxial growth of the III-N material 112, for instance in terms of a bridge lattice constant or amount of defects. For example, a semiconductor that includes aluminum, gallium, and nitrogen (e.g., AlGaN) or a semiconductor that includes aluminum and nitrogen (e.g., AlN) may be used as the buffer material 124 when the III-N material 112 is a semiconductor that includes gallium and nitrogen (e.g., GaN). Other examples of materials for the buffer material 124 may include materials typically used as ILD, described above, such as oxide isolation layers, e.g., silicon oxide, silicon nitride, aluminum oxide, and/or silicon oxynitride. When implemented in the III-N transistor 102, the buffer material 124 may have a thickness between about 100 and 5000 nm, including all values and ranges therein, e.g., between about 200 and 1000 nanometers, or between about 250 and 500 nanometers.

In some embodiments, the IC structure 100 may, optionally, include a hard-mask material 126 over the polarization material 114, as shown in FIG. 1. In some embodiments, the hard-mask material 126 may be silicon nitride.

Although not specifically shown in FIG. 1, the IC structure 100 may further include additional transistors similar to the III-N transistor 102, described above.

Turning now to the Si-based semiconductor material stack 104, FIG. 1 illustrates that the stack 104 may be provided over the insulator material 110, which insulator material 110 is, in turn, provided over some non-Si semiconductor material (e.g., the III-N material 112, the polarization material 114, etc.). As shown, the Si-based semiconductor material stack 104 may include at least two semiconductor material layers which may be referred to as a base semiconductor material 130 and a channel semiconductor material 132. The base semiconductor material 130 is provided between the insulator material 110 and the channel semiconductor material 132, with a first face of the base semiconductor material 130 being in contact with the insulator material 110 and a second face of the based semiconductor material 130 (opposite the first face) being in contact with the channel semiconductor material 132.

The base semiconductor material 130 may include polysilicon, which may be deposited over the insulator material 110 using, e.g., chemical vapor deposition (CVD), then annealed to recrystallize at least some polysilicon grains to obtain larger grains at the top of the polysilicon layer. Then, as described in greater detail with reference to FIG. 3, such a recrystallized polysilicon material that is the base semiconductor material 130 may serve as a seed layer to grow the channel semiconductor material 132 by epitaxial deposition. In this manner, the channel semiconductor material 132 may be a substantially monocrystalline semiconductor material, e.g., monocrystalline Si, or SiGe, which may be used as a channel material for various Si-based transistors.

As used herein, the term "monocrystalline semiconductor" refers to a semiconductor material that is largely monocrystalline, but may include some defects, e.g., some grain boundaries, which may arise unintentionally in semiconductor manufacturing. Therefore, the term "monocrystalline semiconductor" refers to a semiconductor material that is at least 85%, e.g., at least 90% or at least 95%, monocrystalline.

The Si-based semiconductor material stack 104 may serve as a foundation of providing one or more Si-based transistors, e.g., with portions of the channel semiconductor material 132 forming channel regions of such transistors. In some embodiments, the Si-based semiconductor material stack 104 may be provided as an island within the insulator material 110, e.g., as a stack that is otherwise surrounded by the insulator material 110 on some or all sides. Although not specifically shown in FIG. 1, the IC structure 100 may further include additional islands of the Si-based semiconductor material stack 104, which may be electrically isolated from one another with the insulator material 110. Channel regions of different Si-based transistors formed in different such islands may then already be advantageously isolated from one another.

In some embodiments, the IC structure 100 may be included in, or used to implement at least a portion of an RF FE. In some embodiments, the III-N transistor 102 of the IC structure 100 may be included in, or used to implement at least a portion of an RF circuit or a part of a power circuit included in the IC structure. In some embodiments, the Si-based semiconductor material stack 104 of the IC structure 100 may be included in, or used to implement at least a portion of a CMOS circuit included in the IC structure (e.g., control logic, current mirrors, level shifters, buffers, power gating, etc.).

Forming One or More Si-Based Transistors in the Si-Based Semiconductor Material Stack The Si-based semiconductor material stack 104 of the IC structure 100 may serve as a foundation for forming one or more Si-based transistors, with FIGS. 2A-2C providing illustrations of some example implementations. Each of FIGS. 2A-2B illustrates a cross-section of, respectively, IC structures 200A and 200B, similar to that shown in FIG. 1, i.e., an x-z cross-section. FIG. 2C illustrates a cross-section of an IC structure 200C in a plane perpendicular to that of the cross-sections of FIGS. 2A and 2B and perpendicular to the support structure 108, i.e., an y-z cross-section of the example x-y-z coordinate system shown in the figures. Collectively, the IC structures 200A, 200B, and 200C may be referred to as "IC structures 200." Each of FIGS. 2A-2C may be seen as an example of transistor arrangements provided in the IC structure of FIG. 1. Therefore, descriptions provided with reference to FIG. 1 are applicable to the IC structures 200 of FIGS. 2A-2C and, in the interests of brevity, are not repeated here. Instead, only the differences and additional details shown in FIGS. 2A-2C are described. Similar to FIG. 1, a legend provided within a dashed box at the bottom of each of FIGS. 2A-2C illustrates colors/patterns used to indicate some classes of materials of some of the elements shown in FIGS. 2A-2C.

In some embodiments, one or more Si-based transistors formed based on the Si-based semiconductor material stack 104 provided over the insulator material 110 may be TFTs. In general, a TFT is a special kind of a FET, made by depositing a thin film of an active semiconductor material, as well as a dielectric layer and metallic contacts, over a supporting layer that may be a non-conducting layer. During operation of a TFT, at least a portion of the active semiconductor material forms a channel of the TFT, and, therefore, the thin film of such active semiconductor material is referred to herein as a "TFT channel material." This is different from conventional, non-TFT, transistors where the active semiconductor channel material is typically a part of a semiconductor substrate, e.g., a part of a silicon wafer. In this case, the Si-based transistors formed based on the Si-based semiconductor material stack 104 may be TFTs because the active semiconductor material of such transistors is the channel semiconductor material 132 of the Si-based semiconductor material stack 104, which is deposited over the non-conducting layer of the insulator material 110. In various embodiments, any of the Si-based transistors formed using the Si-based semiconductor material stack 104 may be a TFT of any suitable architecture, e.g., a top-gated TFT or a back-gated TFT, with or without fins, etc., as known in the art.

Using the Si-based semiconductor material stack 104 integrated side-by-side with the III-N transistor 102 provides several advantages and enables unique architectures that may not possible otherwise. For example, in some embodiments, the Si-based semiconductor material stack 104 may serve as a foundation for forming one or more PMOS transistors, or one or more NMOS transistors, or any combination of PMOS and other being NMOS transistors, e.g., to implement various CMOS circuits.

FIG. 2A provides a cross-sectional side view illustrating an IC structure 200A that may be a first example of the IC structure 100 of FIG. 1, with a Si-based transistor 204 formed using the Si-based semiconductor material stack 104, according to some embodiments of the present disclosure.

As shown in FIG. 2A, the transistor 204 may be a TFT, provided over a portion of the Si-based semiconductor material stack 104 so that a portion 212 of the channel semiconductor material 132 of the Si-based semiconductor material stack 104 is a channel material of the transistor 204 (namely, a portion of the channel semiconductor material 132 between the source and the drain regions of S/D regions 216 of the transistor 204, with a gate stack 244 adjacent to a portion of the channel material portion 212).

In various embodiments, the channel material portion 212 of the transistor 204 may be composed of semiconductor material systems including, for example, N-type or P-type materials systems, depending on whether the transistor 204 is a PMOS or an NMOS transistor. Thus, if the transistor 204 is a PMOS transistor, then the channel material portion 212 would be an N-type material (i.e., a material doped with N-type dopant atoms), and, if the transistor 204 is an NMOS transistor, then the channel material portion 212 would be a P-type material (i.e., a material doped with P-type dopant atoms). In some embodiments, the dopant concentration of the dopant atoms in the channel material portion 212 (i.e., of the N-type dopants for a transistor 204 and P-type dopants for an NMOS transistor 204) may be at least about $5 \times 10^{17}$ cm$^{-3}$, including all values and ranges therein, e.g., at least about $1 \times 10^{18}$ cm$^{-3}$, at least about $1 \times 10^{13}$ cm$^{-3}$, or at least about $1 \times 10^{20}$ cm$^{-3}$.

In some embodiments, the channel semiconductor material 132 of the stack 104, and, therefore, the channel material portion 212, may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel semiconductor material 132, and, therefore, the channel material portion 212, may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, indium phosphide, and black phosphorus, each of which may possibly be doped with one or more of gallium, indium, aluminum, fluorine, boron, phosphorus, arsenic, nitrogen, tantalum, tungsten, and magnesium, etc. In particular, the channel semiconductor material 132, and, therefore, the channel material portion 212, may be formed of a thin-film material. In some embodiments, the channel semiconductor material 132, and, therefore, the channel material portion 212, may have a thickness between about 5 and 30 nanometers, including all values and ranges therein.

In some embodiments, the channel semiconductor material 132, and, therefore, the channel material portion 212, may include a substantially monocrystalline and/or a polycrystalline material with crystalline grains larger (in at least one dimension) than about 10 nanometers, e.g., larger than about 50 nanometers, larger than about 60 nanometers, or larger than about 70 nanometers. Larger grains may advantageously provide higher mobility and less traps, so may be desirable for achieving adequate performance, variability, and reliability.

As any FET, the transistor 204 includes a pair of S/D regions 216 and a gate stack 244. The channel material portion 212 of the transistor 204 is the portion between the respective S/D regions 216 of the transistor 204, and adjacent to the gate stack 244.

FIG. 2A illustrates an embodiment where the gate stack 244 of the transistor 204 may include the gate dielectric material 120 and a gate electrode material 222. In particular, FIG. 2A illustrates that, in some embodiments, the transistor 204 may be implemented as a top-gated (also referred to as "front-gated") TFT, which means that at least a portion of the channel material portion 212 may be between at least a portion of the gate electrode material of the gate stack 244 of the transistor 204 and the support structure 108, and which also means that at least a portion of the gate dielectric material of the gate stack 244 may be between at least a portion of the gate electrode material of the gate stack 244 and the support structure 108. The top-gated architecture of the transistor 204 may be particularly suitable for integrating the transistor 204 side-by-side with the III-N transistor 102.

In general, the gate dielectric material 120 of the transistor 204 may include any of the materials listed for the gate dielectric material 120 of the III-N transistor 102, and may be either the same or different material than that selected for the gate dielectric material 120 of the III-N transistor 102. Similarly, in general, any of the materials listed for the gate electrode material 122 of the III-N transistor 102 may be suitable for implementing the gate electrode material 222 for the transistor 204.

In some embodiments, some of the materials listed above for the gate electrode material 122 may be used both as the gate electrode material for NMOS and PMOS transistors, e.g., for NMOS and PMOS transistors 204. For example, titanium nitride is a "mid-gap" material with a workfunction that is between N-type and P-type. Therefore, it may be suitable both for implementing the transistor 204 as a PMOS transistor to provide the desired PMOS threshold voltage, and also for implementing the transistor 204 and/or the III-N transistor 102 as an NMOS transistor to provide the desired NMOS threshold voltage. Using the same gate electrode material for the PMOS and NMOS transistors integrated over a single support structure may simplify fabrication as the gate electrode material for both of these types of transistors may then be deposited in a single deposition process. However, in other embodiments, various PMOS and NMOS transistors that may be present in the IC structures 100/200 may use different gate electrode materials.

In some embodiments, to implement an NMOS transistor (e.g., to implement an NMOS III-N transistor 102 and/or the NMOS transistor 204), the gate electrode material may include one or more of hafnium, zirconium, titanium, tantalum, aluminum, alloys of these metals, and carbides of these metals (e.g., hafnium carbide, zirconium carbide, titanium carbide, tantalum carbide, and aluminum carbide), while to implement a PMOS transistor (e.g., to implement the PMOS transistor 204), the gate electrode material may include ruthenium, palladium, platinum, cobalt, nickel, and conductive metal oxides (e.g., ruthenium oxide).

When the transistor 204 is implemented as a PMOS transistor, some of the TFT channel materials listed above for the channel semiconductor material 132 (including the channel material portion 212) may be more suitable than others. Some examples of the channel material portion 212 particularly suitable for a PMOS implementation of the transistor 204 include, but are not limited to, silicon, silicon germanium, germanium, indium antimonide, III-V materials (e.g., gallium arsenide), indium tin oxide, molybdenum diselenide, tungsten diselenide, and black phosphorus. On the other hand, some examples of the channel material portion 212 particularly suitable for an NMOS implementation of the transistor 204 include, but are not limited to, silicon, silicon germanium, germanium, III-V materials (e.g., gallium arsenide), zinc oxide, gallium oxide, titanium oxide, and IGZO.

Although not specifically shown in the present figures, in some embodiments, the gate electrode of the III-N transistor 102 may be electrically coupled to the gate electrode of the transistor 204. When the transistor 204 is implemented as a PMOS transistor, and the III-N transistor 102 is implemented as an NMOS transistor, such a configuration where the gates of these transistors are electrically coupled may be used to implement an inverter device. In other embodiments, e.g., when multiple transistors 204 are included in the IC structure 200A (not shown in FIG. 2A, but shown, e.g., in FIG. 2B), a gate electrode of one transistor 204 may be coupled to a gate electrode of another transistor 204. When one of such transistors 204 is implemented as a PMOS transistor and the other one is implemented as an NMOS transistor, such a configuration where the gates of these transistors are electrically coupled may also be used to implement an inverter device.

In other embodiments of the IC structure 200A, both the transistor 204 and the III-N transistor 102 may be implemented as NMOS devices, or both the transistor 204 and the III-N transistor 102 may be implemented as PMOS devices. In some such embodiments, the transistor 204 and the III-N transistor 102 may still have their gate electrodes coupled or shared (again, not specifically shown in the present figures). Such modified IC structure 200A may be included in any circuits that use cascaded transistors of the same type, such as gate protection circuits. Similarly, in other embodiments of the IC structure 200A where multiple transistors 204 are implemented (not shown in FIG. 2A), two of the transistors 204 may be implemented as NMOS devices, or two of the transistors 204 may be implemented as PMOS devices. In some such embodiments, these two transistors 204 may still have their gate electrodes coupled or shared (again, not specifically shown in the present figures) and such modified IC structures 200A may be included in any circuits that use cascaded transistors of the same type, such as gate protection circuits.

Turning to the S/D regions 216 of the transistor 204, a shown in FIG. 2A, similar to the S/D regions 116 of the III-N transistor 102, the S/D regions 216 of the transistor 204 include two S/D regions 216, where one of these two S/D regions 216 is a source region and another one is a drain region. Also similar to the S/D regions 116, for each transistor 204, S/D electrodes 242 may be provided, interfacing the S/D regions 216 of said transistor 204. In various embodiments, the same or different ones of the electrically conductive material 118 may be used to implement the S/D electrodes 142 of the III-N transistor 102 and the S/D electrodes 242 of the transistor 204.

Yet another similarity to the S/D regions 116, in some embodiments, each of the S/D regions 216 may include portions containing highly doped semiconductor materials. For example, in some embodiments, the doped semiconductor material of the S/D regions 216 may have a dopant concentration of at least $1 \times 10^{18}$ cm$^{-3}$, e.g., of at least $1 \times 10^{20}$ cm$^{-3}$ or of at least $1 \times 10^{21}$ cm$^{-3}$. As for the S/D regions 116, the dopants of the doped semiconductor material of the S/D regions 216 are P-type dopants if the transistor 204 is a PMOS transistor, and the dopants of the doped semiconductor material of the S/D regions 216 are N-type dopants if the transistor 204 is an NMOS transistor.

In some embodiments of the transistor 204, material selection of the doped semiconductor materials used for the S/D regions 216 may be nuanced further. In particular, in some embodiments, a lattice constant of the doped semiconductor material of at least one of the S/D regions 216 (e.g., for both of the S/D regions 216) may be different from the lattice constant of the channel semiconductor material 132 of the stack 104 in order to induce tensile or compressive strain in the channel material portion 212 of the transistor 204. For example, in some embodiments, a lattice constant of the doped semiconductor material of at least one of the S/D regions 216 may be at least about 2% different (e.g., at least about 5% or at least about 10%) from the lattice constant of the channel semiconductor material 132 of the stack 104.

Whether the lattice constant of the doped semiconductor material of at least one of the S/D regions 216 is selected to be larger or smaller than the lattice constant of the channel material portion 212 of the channel semiconductor material 132 may depend on whether the transistor 204 is to be a PMOS or an NMOS transistor. In some embodiments of the transistor 204, each of the doped semiconductor material of at least one of the S/D regions 216 and the channel semiconductor material 132 of the stack 104 may include some combination of silicon and germanium (e.g., $Si_xGe_{1-x}$, where x is a value between 0 and 1) but in different stoichiometry (including x being equal to 0 or to 1), which would lead to different lattice constants of these two materials. Some example materials and considerations are described in greater detail below.

In a first example, if the transistor 204 is to be a PMOS transistor, then a combination of the doped semiconductor material of at least one of the S/D regions 216 and the channel semiconductor material 132 of the stack 104 may be selected to be such that the lattice constant of the doped semiconductor material of at least one of the S/D regions 216 is larger than the lattice constant of the channel semiconductor material 132. In such a case, compressive strain may be induced in the channel semiconductor material 132, which may be particularly advantageous in terms of carrier mobility in the channel material portion 212 when the transistor 204 is a PMOS transistor. In some embodiments of the transistor 204 being a PMOS transistor, each of the doped semiconductor material of at least one of the S/D regions 216 and the channel semiconductor material 132 of the stack 104 may include some combination of silicon and germanium but with the doped semiconductor material of at least one of the S/D regions 216 containing a larger stoichiometric percentage of Ge (or, correspondingly, a smaller stoichiometric percentage of Si) than the channel semiconductor material 132 of the stack 104. Since the lattice constant of Ge is about 0.5658 nanometers and the lattice constant of Si is about 0.5431 nanometers, increasing the stoichiometric percentage of Ge in $Si_xGe_{1-x}$ (i.e., decreasing the value of x) would increase the lattice constant of the SiGe. For example, in some embodiments of the transistor 204 being a PMOS transistor, the channel semiconductor material 132 of the stack 104 may include silicon (e.g., $Si_xGe_{1-x}$ with x=1) while the doped semiconductor material of at least one of the S/D regions 216 may include $Si_xGe_{1-x}$ with x being less than 1. In some such embodiments, the doped semiconductor material of at least one of the S/D regions 216 may include $Si_{1-x}Ge_x$ with x being substantially equal to 1 (i.e., the doped semiconductor material of at least one of the S/D regions 216 may include substantially 100% Ge, in terms of a percentage of Ge to Si). For completeness, for the embodiments where the transistor 204 is a PMOS transistor, the dopant atoms of the doped semiconductor material of the S/D regions 216 are P-type dopant atoms, e.g., boron atoms, while the channel material portion 212 of the transistor 204 would include the channel semiconductor material 132 of the stack 104 doped with N-type dopant atoms, e.g., phosphorous or arsenic atoms, e.g., in dopant concentrations between about $1 \times 10^{17}$ cm$^{-3}$ and $1 \times 10^{20}$ cm$^{-3}$, including all values and ranges therein.

In a second example, if the transistor 204 is to be an NMOS transistor, then a combination of the doped semiconductor material of at least one of the S/D regions 216 and the channel semiconductor material 132 of the stack 104 may be selected to be such that the lattice constant of the doped semiconductor material of at least one of the S/D regions 216 is smaller than the lattice constant of the channel semiconductor material 132. In such a case, tensile strain may be induced in the channel semiconductor material 132, which may be particularly advantageous in terms of carrier mobility in the channel material portion 212 when the transistor 204 is an NMOS transistor. In some embodiments of the transistor 204 being an NMOS transistor, each of the doped semiconductor material of at least one of the S/D regions 216 and the channel semiconductor material 132 of the stack 104 may include some combination of silicon and germanium but with the doped semiconductor material of at least one of the S/D regions 216 containing a smaller stoichiometric percentage of Ge (or, correspondingly, a larger stoichiometric percentage of Si) than the channel semiconductor material 132 of the stack. For example, in some embodiments of the transistor 204 being an NMOS transistor, the doped semiconductor material of at least one of the S/D regions 216 may include silicon (e.g., $Si_xGe_{1-x}$ with x=1) while the channel semiconductor material 132 of the stack 104 may include $Si_xGe_{1-x}$ with x being less than 1. In some such embodiments, the channel semiconductor material 132 of the stack 104 may include $Si_xGe_{1-x}$ with x being substantially equal to 0 (i.e., the channel semiconductor material 132 of the stack 104 may include substantially 100% Ge, in terms of a percentage of Ge to Si). For completeness, for the embodiments where the transistor 204 is an NMOS transistor, the dopant atoms of the doped semiconductor material of the S/D regions 216 are N-type dopant atoms, e.g., phosphorous and/or arsenic atoms, while the channel material portion 212 of the transistor 204 would include the channel semiconductor material 132 of the stack 104 doped with P-type dopant atoms, e.g., boron atoms, e.g., in dopant concentrations between about $1 \times 10^{17}$ cm$^{-3}$ and $1 \times 10^{20}$ cm$^{-3}$, including all values and ranges therein.

FIG. 2B provides a cross-sectional side view illustrating an IC structure 200B that may be a second example of the IC structure 100 of FIG. 1, with Si-based transistors 204-1 and 204-2 fabricated using respective Si-based semiconductor material stacks 104-1 an 104-2 provided by semiconductor regrowth over an insulator material, according to some embodiments of the present disclosure. Each of the two Si-based transistors 204-1 and 204-2 may be implemented as the transistor 204 according to any of the embodiments described above with reference to FIG. 2A, which descriptions, therefore, in the interests of brevity, are not repeated here.

What FIG. 2B illustrates specifically is that, in some embodiments, different Si-based transistors 204-1 and 204-2 may be implemented using different islands of the Si-based semiconductor material stack 104 (different instances of such a stack shown in FIG. 2B as a stack 104-1 and a stack 104-2). In some such embodiments, the channel semiconductor materials of the Si-based semiconductor material stacks 104-1 and 104-2 may be different, as shown in FIG. 2B with the stack 104-1 including the channel semiconductor material 132 as described above and with the stack 104-2 including a channel semiconductor material 232 instead. In various embodiments, the channel semiconductor material 232 may include any of the materials described above with reference to the channel semiconductor material 132, but may (but does not have to be) a different material from the one selected for the channel semiconductor material 132. Also the gate stacks 244-1 and 244-2 of the transistors 204-1 and 204-2 may be different. In particular, the gate electrode materials of these gate stacks may be different, as shown in FIG. 2B with the gate stack 244-1 including the gate electrode material 222 as described above and with the gate stack 244-2 including a gate electrode material 252 instead. In various embodiments, the gate electrode material 252 may include any of the materials described above with reference to the gate electrode material 222, but may (but does not have to be) a different material from the one selected for the gate electrode material 222, which may be particularly suitable if one of the transistors 204 of FIG. 2B is a PMOS transistor and the other one is an NMOS transistor. Similarly, the materials of S/D regions of the transistors 204-1 and 204-2 may be different. In particular, FIG. 2B illustrates that the transistor 204-1 may include the S/D regions 216 as described above, while the transistor 204-2 may include S/D regions 256 instead. In various embodiments, the S/D regions 256 may include any of the materials described above with reference to the S/D regions 216, but may (but does not have to be) different material(s) from the one selected for the S/D regions 216, which, again, may be particularly suitable if one of the transistors 204 of FIG. 2B is a PMOS transistor and the other one is an NMOS transistor.

Although not specifically shown in FIG. 2B, in some embodiments, a gate electrode material of the first transistor 204-1 may be coupled to a gate electrode material of the second transistor 204-2. When one of the transistors 204-1 or 204-2 is implemented as a PMOS transistor and the other one is implemented as an NMOS transistor, such a configuration where the gates of these transistors are electrically coupled may also be used to implement an inverter device. When both of the transistors 204-1 and 204-2 are implemented as PMOS transistor, or both are implemented as NMOS transistors, such a configuration where the gates of these transistors are electrically coupled may also be used to implement a cascaded circuit, such as a gate protection circuit. Although also not specifically shown in FIG. 2B, in some embodiments, a source or a gate electrode of the first transistor 204-1 may be coupled to a source or a gate electrode of the second transistor 204-2, which may be used to form, e.g., a cascode amplifier device.

Various material compositions which may be used to form the channel material portions and S/D regions of the transistors 204-1 and 204-2 may be those described with reference to FIG. 2A, where the materials would be selected based on whether different ones of the transistors 204-1 and 204-2 are PMOS or NMOS transistors.

FIG. 2C provides a cross-sectional side view illustrating a third example of an IC structure 200C with fins 260 formed from the Si-based semiconductor material stack 104 provided by semiconductor regrowth over the insulator material 110, according to some embodiments of the present disclosure. FIG. 2C illustrates 5 example fins 260, labeled as fins 260-1 through 260-5, but, in various embodiments, any number of fins 260 may be formed from the Si-based semiconductor material stack 104 and included in a single transistor 204. Thus, the transistor 204 may be a Si-based finFET, with one or more fins formed from the Si-based semiconductor material stack 104. The cross-section shown in FIG. 2C may be any cross-section in the y-z plane for the transistor 204 as described with reference to FIG. 2A, illustrating that the electrically conductive material 118 which may be used to implement any of source, drain, or gate contacts may extend over (e.g., be electrically continuous over), a plurality of fins 260 of a single transistor 204. In various embodiments, a given fin 260 may be between about 20 and 100 nanometers tall and have a width about 3 and 30 nanometers, including all values and ranges therein. Providing integrated Si-based FinFETs may further reduce short channel effects and leakage in the IC structure 200C.

Variations and Implementations

Figure 2A:
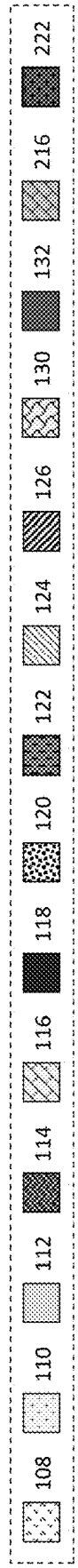
Figure 2B:
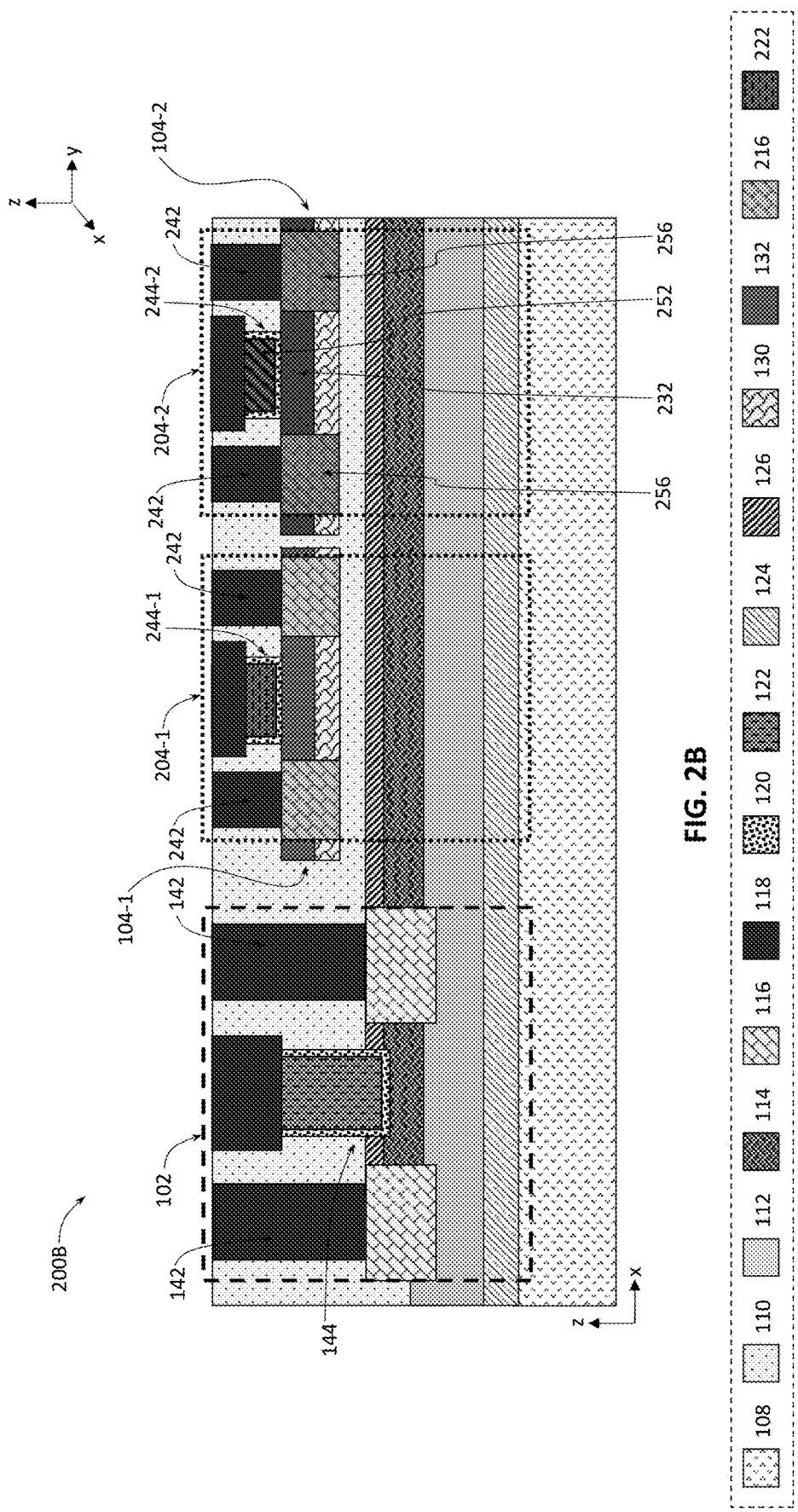
FIG. 2B provides a cross-sectional side view illustrating a second example of an IC structure with an NMOS and a PMOS Si-based transistors fabricated using respective Si-based semiconductor material stacks provided by semiconductor regrowth over an insulator material, according to some embodiments of the present disclosure.

The IC structures 100/200 illustrated in FIGS. 1-2 do not represent an exhaustive set of assemblies in which one or more Si-based transistors 204 may be integrated with one or more non-Si devices such as III-N transistors 104 over a single support structure 108 (e.g., a substrate), as described herein, but merely provide examples of such structures/assemblies.

Although particular arrangements of materials are discussed with reference to FIGS. 1-2, intermediate materials may be included in various portions of these figures. Note that FIGS. 1-2 are intended to show relative arrangements of some of the components therein, and that various device components of these figures may include other components that are not specifically illustrated, e.g., various interfacial layers or various additional layers or elements. For example, although not specifically shown, the IC structures 100/200 may include a solder resist material (e.g., polyimide or similar material) and one or more bond pads formed on upper-most interconnect layer of the IC structure, e.g., at the top of the IC structures 100/200 shown in FIGS. 1-2. The bond pads may be electrically coupled with a further interconnect structure and configured to route the electrical signals between one or more Si-based transistors 204 and various external devices, and/or between one or more non-Si devices such as III-N transistors 104 and external devices, and/or between one or more Si-based transistors 204 and one or more non-Si devices such as III-N transistors 104. For example, solder bonds may be formed on the one or more bond pads to mechanically and/or electrically couple a chip including the IC structures 100/200 with other components (e.g., a circuit board). The IC structures 100/200 may have other alternative configurations to route the electrical signals from the interconnect layers, e.g., the bond pads described above may be replaced by or may further include other analogous features (e.g., posts) that route the electrical signals to external components.

Furthermore, although the III-N transistor 102 is shown with the III-N channel material 112 being between the polarization material 114 and the support structure 108 and with the polarization material 114 being between the III-N channel material 112 and the gate stack 144, in other embodiments, the polarization material 114 may be between the III-N channel material 112 and the support structure 108, and the III-N channel material 112 may be between the polarization material 114 and the gate stack 144. In such embodiments, the 2DEG may be formed just above the interface of the polarization material 114 and the III-N channel material 112 (i.e., further away from the support structure 108 than the polarization material 114). Also, in such embodiments, the gate stack 144 may be provided in a recess in the III-N channel material 112 so that the gate stack 114 is relatively close to the 2DEG.

Still further, although the gate stack 144 of the III-N transistor 102 is shown to include the gate dielectric material 120, in other embodiments the gate dielectric material 120 may be excluded. In such embodiments, the gate electrode material 122 of the gate stack 144 may form a Schottky contact with the semiconductor material of the III-N channel stack (e.g., either with the polarization material 114 or the III-N channel material 112, depending on whether the polarization material 114 is above the III-N channel material 112 as shown in the present figures, or below the III-N channel material 112 as described above).

Additionally, although some elements of the IC structures are illustrated in FIGS. 1-2 as being planar rectangles or formed of rectangular solids, this is simply for ease of illustration, and embodiments of various ones of these elements may be curved, rounded, or otherwise irregularly shaped as dictated by, and sometimes inevitable due to, the manufacturing processes used to fabricate semiconductor device assemblies. For example, while FIGS. 1-2 may illustrate various elements, e.g., the S/D regions 116/216, the S/D electrodes 142/242, etc., as having perfectly straight sidewall profiles, i.e., profiles where the sidewalls extend perpendicularly to the support structure 108, these idealistic profiles may not always be achievable in real-world manufacturing processes. Namely, while designed to have straight sidewall profiles, real-world openings that may be formed as a part of fabricating various elements of the IC structures shown in FIGS. 1-2 may end up having either so-called "re-entrant" profiles, where the width at the top of the opening is smaller than the width at the bottom of the opening, or "non-re-entrant" profile, where the width at the top of the opening is larger than the width at the bottom of the opening. Oftentimes, as a result of a real-world opening not having perfectly straight sidewalls, imperfections may form within the materials filling the opening. For example, typical for re-entrant profiles, a void may be formed in the center of the opening, where the growth of a given material filling the opening pinches off at the top of the opening. Therefore, descriptions of various embodiments of integrating one or more Si-based transistors 204 with one or more non-Si devices such as III-N transistors 104 provided herein are equally applicable to embodiments where various elements of such integrated structures look different from those shown in the figures due to manufacturing processes used to form them.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of the integration of one or more Si-based transistors with one or more non-Si devices such as III-N transistors as described herein.

Figure 3:
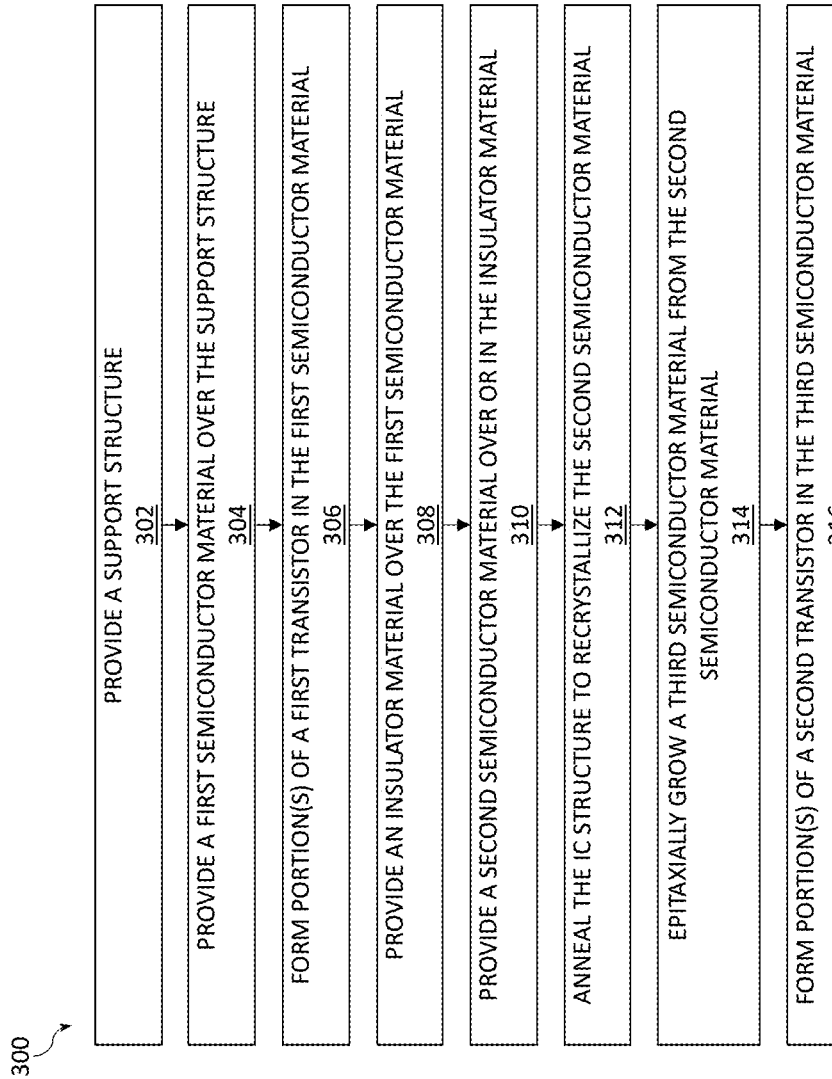
FIG. 3 is a flow diagram of an example method of manufacturing an IC structure that includes a Si-based transistor integrated with a non-Si transistor by semiconductor regrowth over an insulator material, in accordance with various embodiments of the present disclosure.

Manufacturing Si-Based Devices Integrated with Non-Si-Based Devices Using Semiconductor Regrowth The IC structures implementing one or more Si-based transistors integrated with one or more non-Si devices such as III-N transistors as described herein may be manufactured using any suitable techniques. FIG. 3 illustrates one example of such a method. However, other examples of manufacturing any of the IC structures described herein, as well as larger devices and assemblies that include such structures (e.g., as shown in FIGS. 6-9) are also within the scope of the present disclosure.

FIG. 3 is a flow diagram of an example method 300 of manufacturing an IC structure that includes a Si-based transistor integrated with a non-Si transistor by semiconductor regrowth over an insulator material, in accordance with various embodiments of the present disclosure. Although the operations of the method 300 are illustrated once each and in a particular order, the operations may be performed in any suitable order and repeated as desired. For example, one or more operations may be performed in parallel to manufacture, substantially simultaneously, multiple Si-based transistors and/or multiple non-Si devices such as III-N transistors as described herein. In another example, the operations may be performed in a different order to reflect the structure of a particular device assembly in which one or more Si-based transistors integrated with one or more non-Si devices such as III-N transistors as described herein will be included.

In addition, the example manufacturing method 300 may include other operations not specifically shown in FIG. 3, such as various cleaning or planarization operations as known in the art. For example, in some embodiments, the support structure 108, as well as layers of various other materials subsequently deposited thereon, may be cleaned prior to, after, or during any of the processes of the method 300 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the structures/assemblies described herein may be planarized prior to, after, or during any of the processes of the method 300 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Various operations of the method 300 may be illustrated with reference to the example embodiment shown in FIGS. 4A-4G, illustrating fabrication of an IC structure as shown in the example of FIG. 2A, but the method 300 may be used to manufacture any suitable IC structures having one or more Si-based transistors integrated with one or more non-Si devices such as III-N transistors according to any other embodiments of the present disclosure. FIGS. 4A-4G illustrate cross-sectional side views similar to the view shown in FIG. 2A, in various example stages in the manufacture of an IC structure using the method of FIG. 3 in accordance with some embodiments of the present disclosure.

Figure 4A:
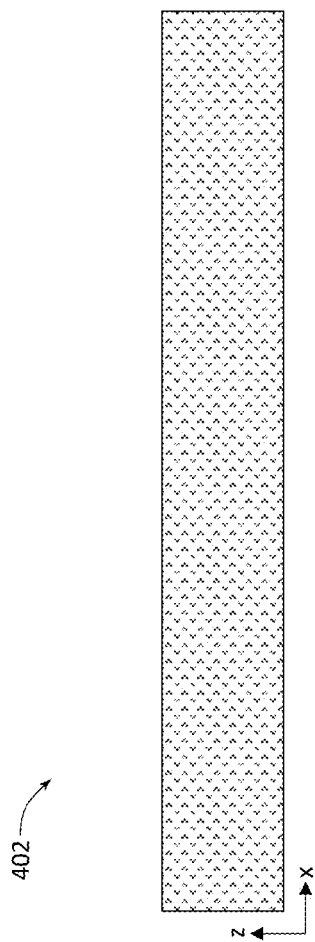
FIGS. 4A-4G are various views illustrating different example stages in the manufacture of an IC structure that includes a Si-based transistor integrated with a non-Si transistor using the method of FIG. 3, according to some embodiments of the present disclosure.
Figure 4A:
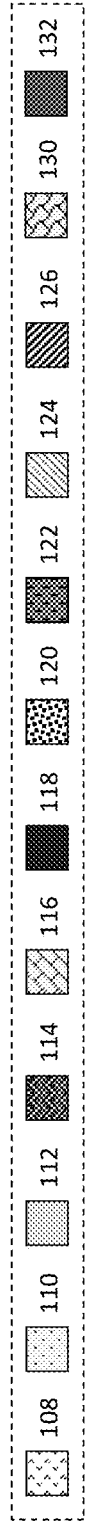

The method 300 may begin with providing a support structure (process 302 shown in FIG. 3, a result of which is illustrated with an IC structure 402 shown in FIG. 4A). The IC structure 402 illustrates that the support structure provided in 302 may be the support structure 108 as described above.

Figure 4B:
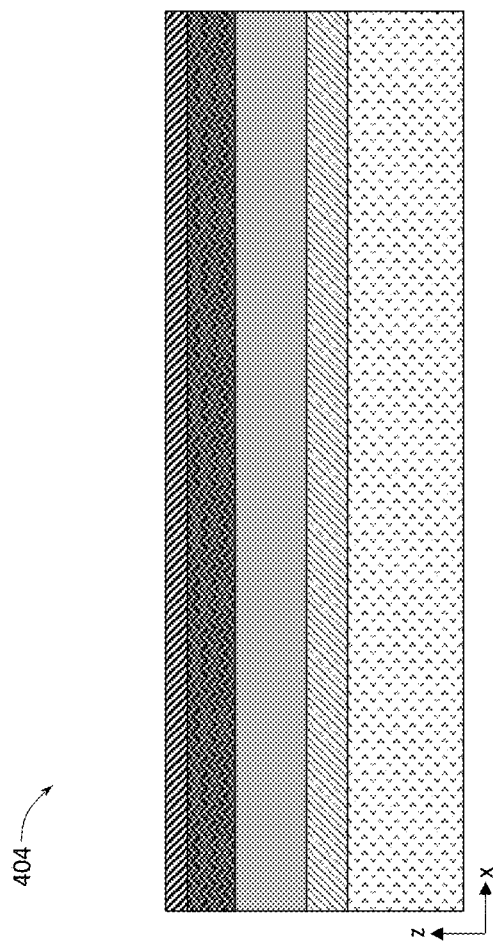
Figure 4B:
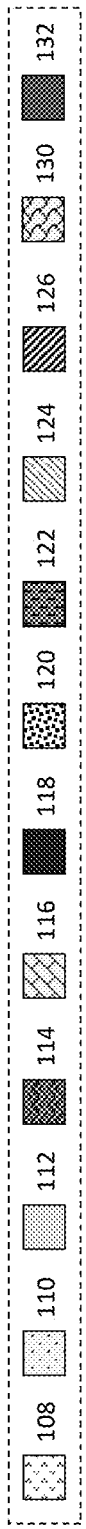

The method 300 may then proceed with providing a layer of a first semiconductor material over the support structure provided in 302 (process 304 shown in FIG. 3, a result of which is illustrated with an IC structure 404 shown in FIG. 4B). The first semiconductor material provided in 304 may be a non-Si semiconductor material that may serve as a foundation for forming a non-Si based device, e.g., a non-Si transistor. For example, the first semiconductor material provided in 304 may be the III-N channel material 112 as described herein. The example of the IC structure 404 illustrates that, in the process 304, first, the buffer material 124 may be provided over the support structure 108, and then the III-N material 112 may be provided over the buffer material 124. In some embodiments, the process 304 may also include depositing the polarization material 114 over the III-N material 112, and, optionally, of the hard-mask material 126 over the polarization material 114 (also shown in FIG. 4B).

In some embodiments, the process 304 may include epitaxially growing various transistor films, e.g., for forming the buffer material 124, the III-N material 112, and the polarization material 114. In this context, "epitaxial growth" refers to the deposition of crystalline overlayers in the form of the desired materials. The epitaxial growth of various layers of the process 304 may be carried out using any known gaseous or liquid precursors for forming the desired material layers.

Figure 4C:
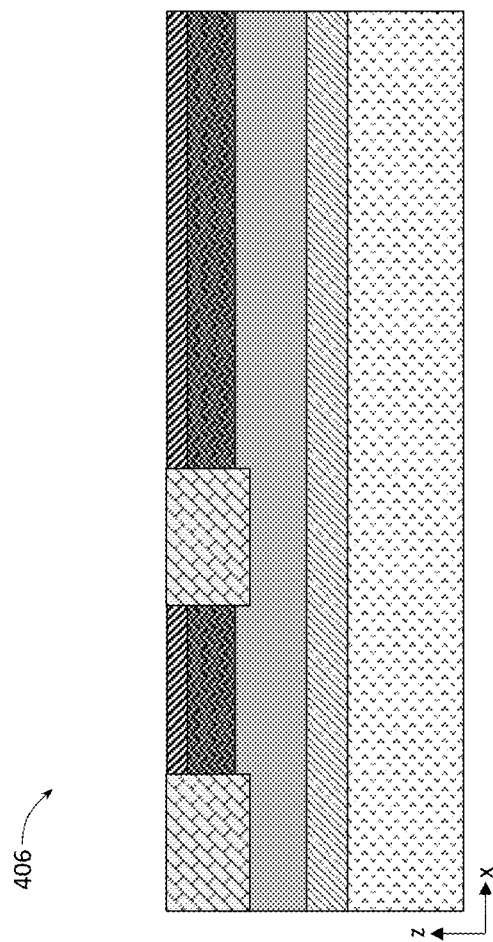
Figure 4C:
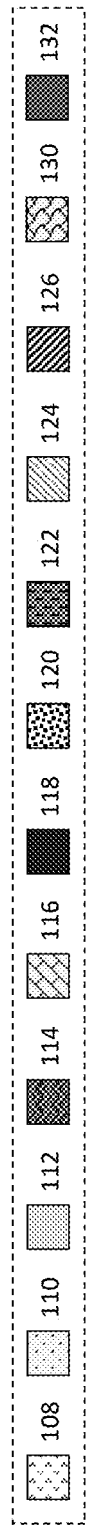

The method 300 may then proceed with patterning portions of the first semiconductor material provided in the process 304 to form at least portions of a first transistor (process 306 shown in FIG. 3, a result of which is illustrated with an IC structure 406 shown in FIG. 4C). The IC structure 406 illustrates that the process 306 may include forming the S/D regions 116 in the upper portion of the one or more materials provided in the process 304.

In some embodiments of the process 306, the S/D regions 116 or different portions thereof may be formed using an implantation/diffusion process or an etching/deposition process, for example. In the former process, dopants such as boron, aluminum, antimony, phosphorous, or arsenic may be ion-implanted into the one or more materials provided in the process 304 (in particular, into the III-N material 112) to form the S/D regions 116 or different portions thereof. An annealing process that activates the dopants and causes them to diffuse farther into the III-N material 112 may follow the ion-implantation process. In some embodiments, annealing may be performed at temperatures above about 600 degrees Celsius, e.g., at temperatures between about 600 and 1200 degrees Celsius, or at temperatures between about 800 or 1000 and 1200 degrees Celsius. In the latter process, the one or more materials provided in the process 304 (in particular, into the III-N material 112) may first be etched to form recesses at the locations of the S/D regions 116, or different portions thereof. An epitaxial deposition process may then be carried out to fill the recesses with material that is used to fabricate the S/D regions 116. In further embodiments, one or more layers of metal and/or metal alloys may be used to form the S/D regions 116 or different portions thereof.

Figure 4D:
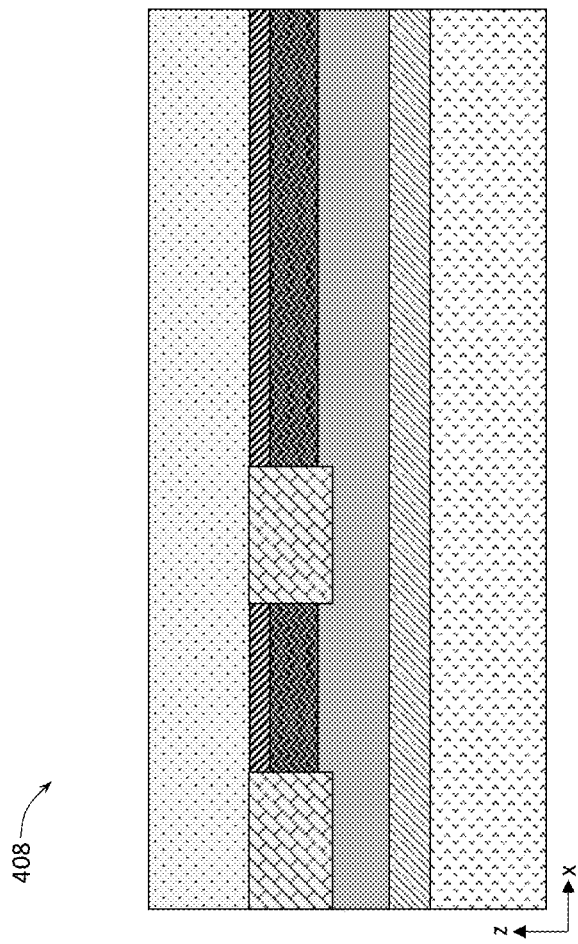
Figure 4D:
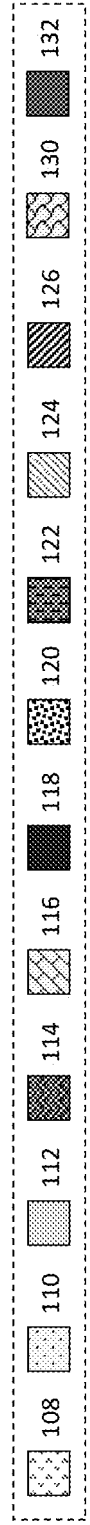

The method 300 may then proceed with providing a layer of an insulator material over the first semiconductor material provided in the process 304 (process 308 shown in FIG. 3, a result of which is illustrated with an IC structure 408 shown in FIG. 4D). The IC structure 408 illustrates that the process 308 may include providing the insulator 110 over the one or more materials provided in the process 304 and over the S/D regions 116 formed in the process 306. In various embodiments, the insulator 110 may be provided using, e.g., spin-coating, dip-coating, CVD, atomic layer deposition (ALD), etc.

Figure 4E:
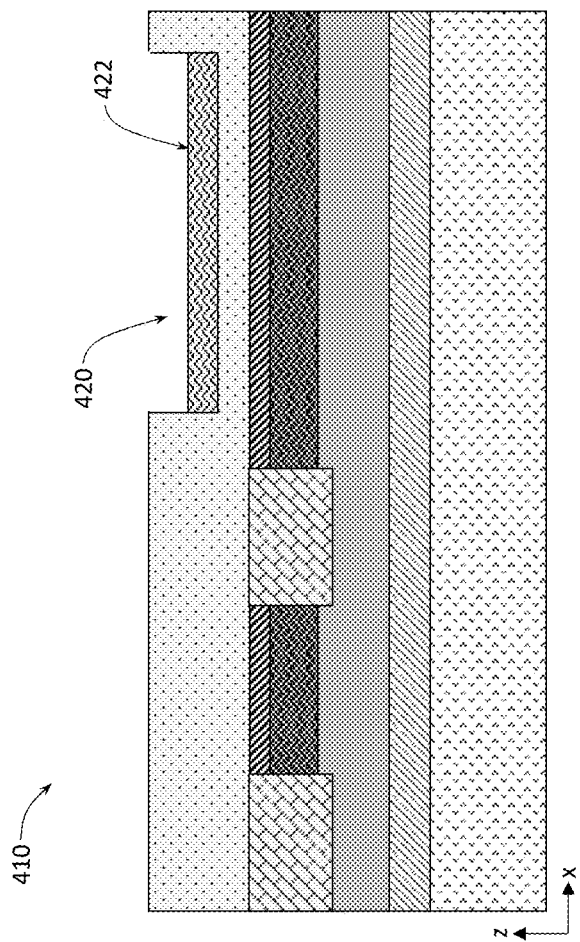
Figure 4E:
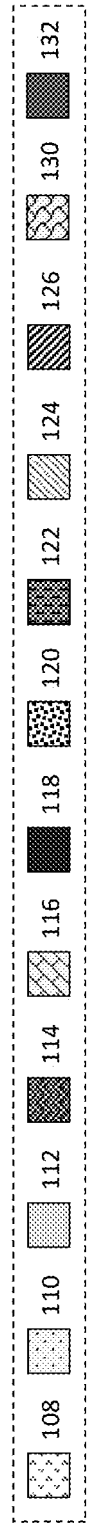

The method 300 may then proceed with providing a second semiconductor material over or in an opening in the insulator material provided in the process 308 (process 310 shown in FIG. 3, a result of which is illustrated with an IC structure 410 shown in FIG. 4E). The IC structure 410 illustrates that the process 310 may include providing an opening 420 in the insulator 110 and then depositing a material 422 in the opening 420, where the material 422 may be converted into the base semiconductor material 130 in the process 312 shown in FIG. 3. For example, in some embodiments, the material 422 provided in the process 308 may include polysilicon deposited by a method such as CVD.

Figure 4F:
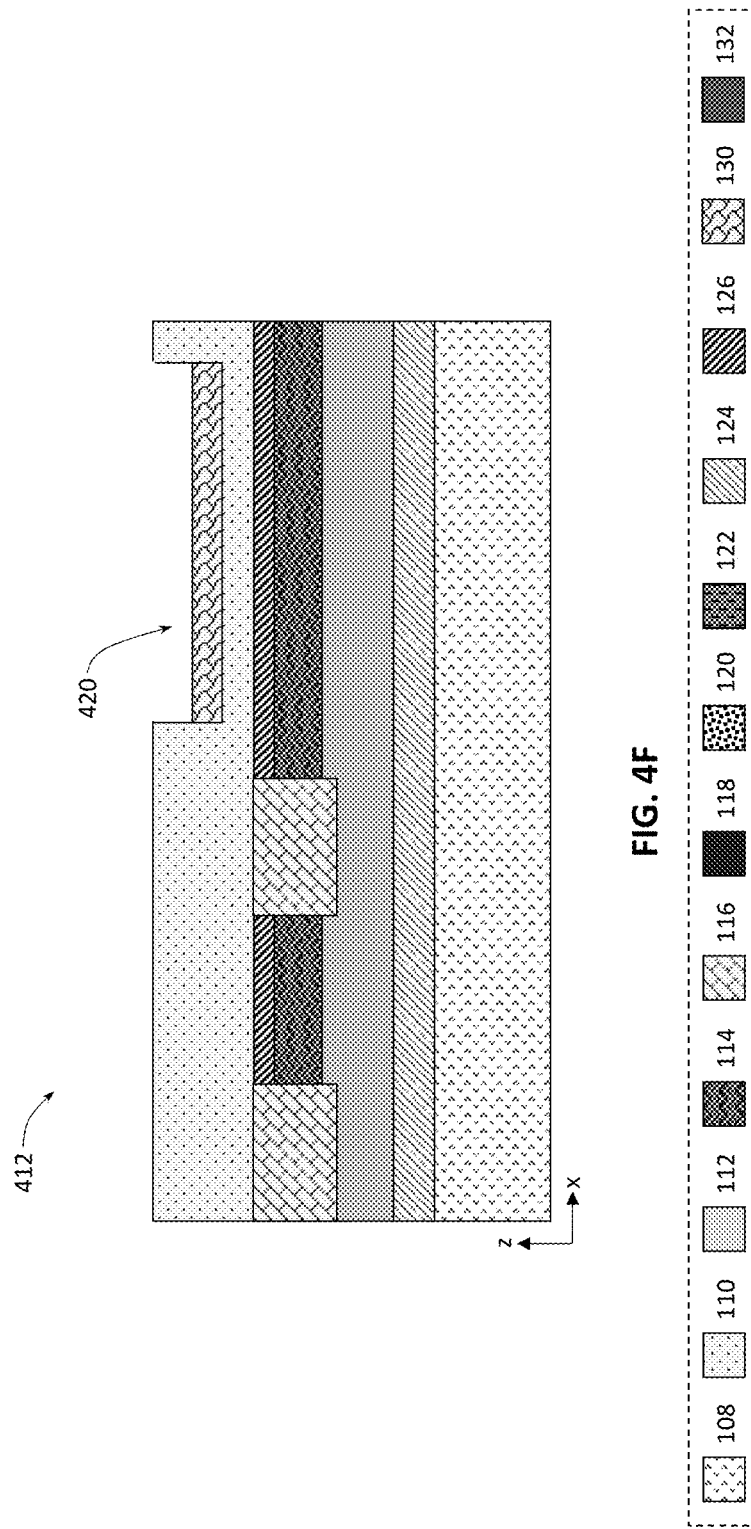

The method 300 may then proceed with annealing the IC structure to recrystallize the semiconductor material provided in the process 310 (process 312 shown in FIG. 3, a result of which is illustrated with an IC structure 412 shown in FIG. 4F). The IC structure 412 illustrates that the process 312 may result in the material 422 being converted to the base semiconductor material 130, described above. In some embodiments, performing the anneal in the process 312 may include placing the IC structure (e.g., the IC structure 410 or 412) in an environment having a temperature of at least about 400 degrees Celsius, including all values and ranges therein (e.g., the temperature of at least about 600 degrees Celsius, or the temperature of at least about 1000 degrees Celsius; e.g., up to about 800 or 1000 degrees Celsius), for a time period of at least about 10 seconds, including all values and ranges therein (e.g., for a time period of at least 2 minutes, or for a time period of at least 5 minutes).

As a result of performing the anneal in the process 312, the material 422 deposited in the process 310 may be recrystallized, to obtain larger grains of the semiconductor material at the top of the material 422 (now converted into the base semiconductor material 130). For example, before the anneal, the material 422 may include grains of about 10 to 50 nanometers in their longest dimension, while after the anneal of the process 312, the base semiconductor material 130 (or at least the upper portion thereof) may include grains larger (in at least one dimension) than, e.g., about 50 nanometers, e.g., larger than about 100 nanometers, larger than about 150 nanometers, or larger than about 200 nanometers, e.g., between about 50 and 1000 nanometers.

Figure 4G:
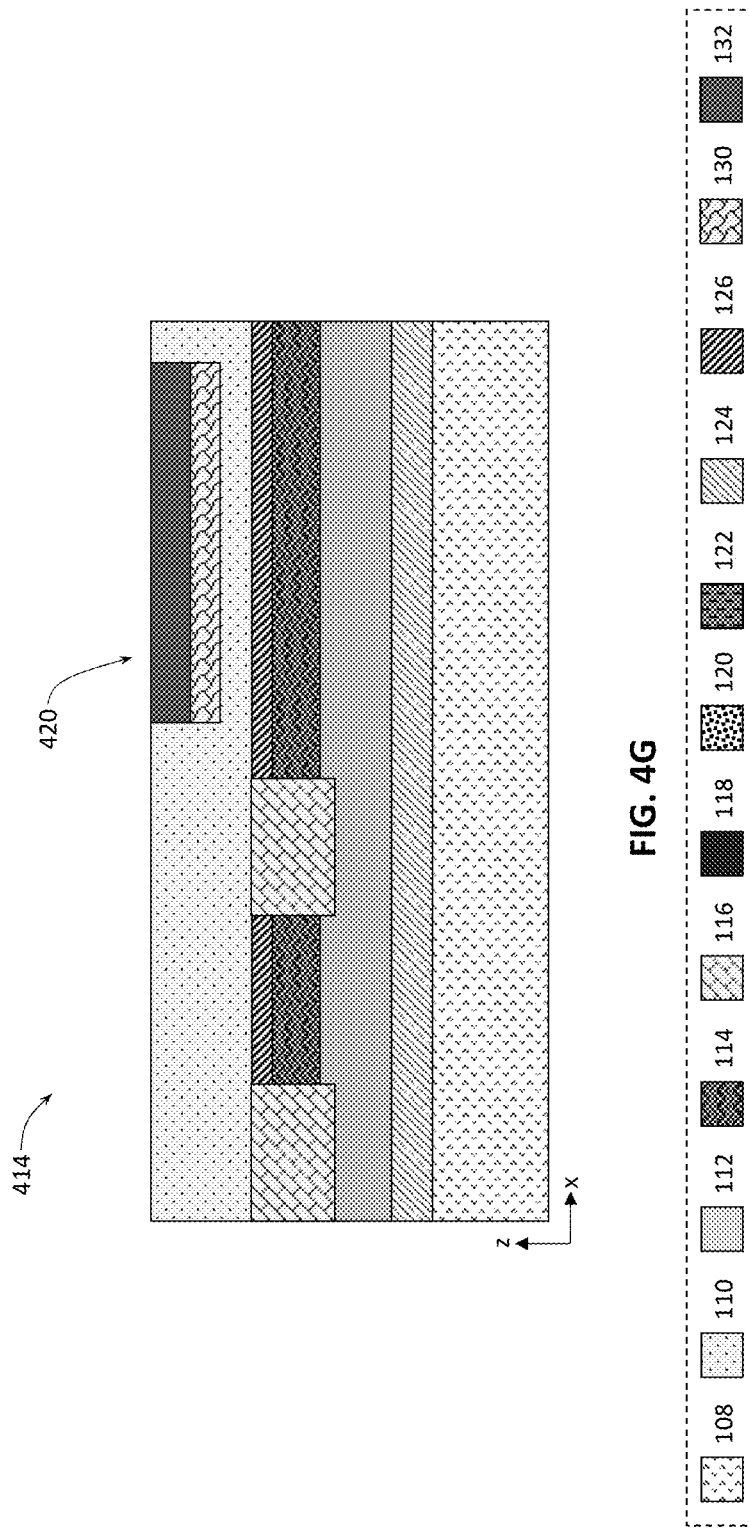

The method 300 may then proceed with depositing a third semiconductor material on the second semiconductor material which has been recrystallized in the process 312 (process 314 shown in FIG. 3, a result of which is illustrated with an IC structure 414 shown in FIG. 4G). The IC structure 414 illustrates that the recrystallized polysilicon material that is the base semiconductor material 130 may serve as a seed layer for deposition of the channel semiconductor material 132 in the process 314. Thus, in some embodiments, the channel semiconductor material 132 may be grown, e.g., by epitaxial deposition, from the base semiconductor material 130. In this manner, the channel semiconductor material 132 may be a substantially monocrystalline semiconductor material, e.g., monocrystalline Si, or SiGe, which may be used as a channel material for various Si-based transistors as described above. Together, the base channel material 130 and the channel semiconductor material 132 form the Si-based semiconductor material stack 104 as described herein.

The method 300 may also include providing at least portions of a second transistor based on the Si-based semiconductor material stack 104, in particular, based on the third semiconductor material provided in the process 314 (process 316 shown in FIG. 3, a result of which is not illustrated in FIG. 4 because the result could be, e.g., the IC structure 100 shown in FIG. 1 or any of the IC structures 200A, 200B, or 200C, as shown in FIG. 2, or any combination thereof, or any further embodiments of these IC structures as described herein). In some embodiments, the second transistor formed in the process 316 may be the transistor 204 according to any one of the embodiments described above. In some embodiments, the process 316 may include forming S/D regions of the second transistor using processes similar to those used to form the S/D regions 116 of the first transistor.

In various embodiments, various processes of the method 300 may include any suitable deposition and patterning techniques for fabricating portions of the III-N transistor 102 and portions of the Si-based semiconductor material stack 104 and/or of the transistor 204 as described herein. For example, any suitable deposition techniques may be used to deposit the insulator 110, such as, but not limited to, spin-coating, dip-coating, ALD, physical vapor deposition (PVD) (e.g., evaporative deposition, magnetron sputtering, or e-beam deposition), or CVD. Examples of deposition techniques that may be used to provide various electrode materials include, but are not limited to, ALD, PVD (including sputtering), CVD, or electroplating. Examples patterning techniques that may be used in any of the processes of the method 300 may include, but are not limited to, photolithographic or electron-beam (e-beam) patterning, possibly in conjunction with a suitable etching technique, e.g., a dry etch, such as RF reactive ion etch (RIE) or inductively coupled plasma (ICP) RIE. In various embodiments, any of the etches performed in the method 300 may include an anisotropic etch, using etchants in a form of e.g., chemically active ionized gas (i.e., plasma) using e.g., bromine (Br) and chloride (CI) based chemistries. In some embodiments, during any of the etches of the method 300, the IC structure may be heated to elevated temperatures, e.g., to temperatures between about room temperature and 200 degrees Celsius, including all values and ranges therein, to promote that byproducts of the etch are made sufficiently volatile to be removed from the surface.

Example Structures and Devices with Si-Based Devices Integrated with Non-Si Devices IC structures that include at least one non-Si based device (e.g., at least one III-N transistor) integrated with one or more Si-based devices provided by semiconductor regrowth over an insulator material as disclosed herein may be included in any suitable electronic device. FIGS. 5-9 illustrate various examples of devices and components that may include one or more Si-based devices integrated with one or more non-Si technology devices by semiconductor regrowth over an insulator material as disclosed herein.

FIGS. 5A-5B are top views of a wafer 2000 and dies 2002 that may include one or more So-based devices (e.g., one or more Si-based transistors) integrated with one or more non-Si technology devices (e.g., one or more III-N transistors) by semiconductor regrowth over an insulator material in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more Si-based devices integrated with one or more non-Si technology devices by semiconductor regrowth over an insulator material as described herein). After the fabrication of the semiconductor product is complete (e.g., after manufacture of at least one Si-based device integrated with one or more non-Si based devices as described herein, e.g., after manufacture of any embodiment of the IC structures 100/200 described herein), the wafer 2000 may undergo a singulation process in which each of the dies 2002 is separated from one another to provide discrete "chips" of the semiconductor product. In particular, devices that include one or more Si-based devices integrated with one or more non-Si technology devices by semiconductor regrowth over an insulator material as disclosed herein may take the form of the wafer 2000 (e.g., not singulated) or the form of the die 2002 (e.g., singulated). The die 2002 may include one or more Si-based devices, one or more non-Si based devices, as well as, optionally, supporting circuitry to route electrical signals to these and other devices, as well as any other IC components. In some embodiments, the wafer 2000 or the die 2002 may implement an RF FE device, a memory device (e.g., a static random-access memory (SRAM) device), a logic device (e.g., an AND, OR, NAND, or NOR gate), or any other suitable circuit element. Multiple ones of these devices may be combined on a single die 2002.

Figure 6:
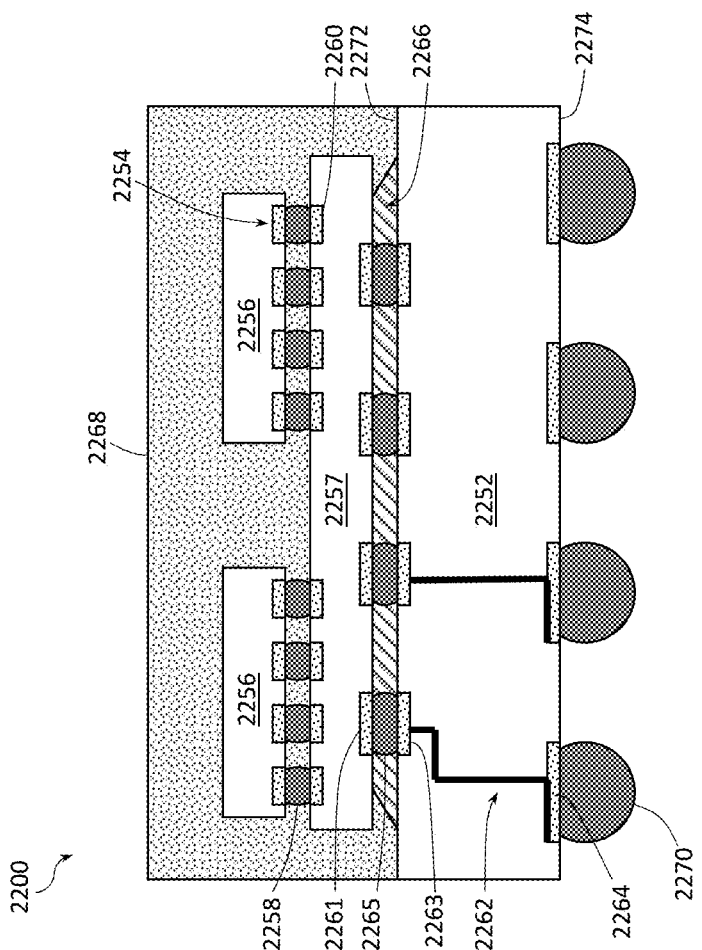
FIG. 6 is a cross-sectional side view of an IC package that may include one or more IC structures having one or more Si-based devices integrated with one or more non-Si technology devices by semiconductor regrowth over an insulator material in accordance with any of the embodiments of the present disclosure.

FIG. 6 is a side, cross-sectional view of an example IC package 2200 that may include one or more Si-based devices integrated with one or more non-Si technology devices by semiconductor regrowth over an insulator material in accordance with any of the embodiments disclosed herein. In some embodiments, the IC package 2200 may be a system-in-package (SiP).

As shown in FIG. 6, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein and may include any of the embodiments of an IC structure having one or more Si-based devices integrated with one or more non-Si based devices by semiconductor regrowth over an insulator material, described herein. In embodiments in which the IC package 2200 includes multiple dies 2256, the IC package 2200 may be referred to as a multi-chip-package (MCP). The dies 2256 may include circuitry to perform any desired functionality. For example, one or more of the dies 2256 may be RF FE dies which may include one or more Si-based devices integrated with one or more non-Si technology devices as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more Si-based devices integrated with one or more non-Si technology devices by semiconductor regrowth over an insulator material, e.g., as discussed above; in some embodiments, at least some of the dies 2256 may not include any Si-based devices and/or not include any non-Si based devices as described herein.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 7:
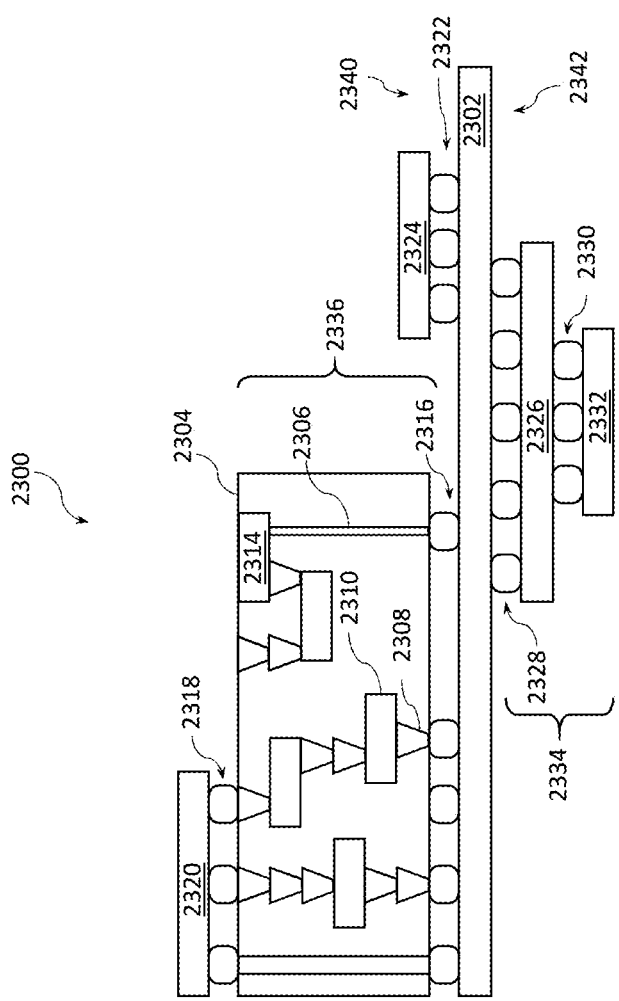
FIG. 7 is a cross-sectional side view of an IC device assembly that may include one or more IC structures having one or more Si-based devices integrated with one or more non-Si technology devices by semiconductor regrowth over an insulator material in accordance with any of the embodiments of the present disclosure.

FIG. 7 is a cross-sectional side view of an IC device assembly 2300 that may include components having one or more IC structures implementing one or more Si-based devices integrated with one or more non-Si based devices by semiconductor regrowth over an insulator material in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC structures implementing one or more Si-based devices integrated with one or more non-Si technology devices by semiconductor regrowth over an insulator material in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include one or more Si-based devices integrated with one or more non-Si technology devices by semiconductor regrowth over an insulator material in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device (e.g., the IC structure of FIGS. 1-2), or any other suitable component. In particular, the IC package 2320 may include one or more Si-based devices integrated with one or more non-Si devices by semiconductor regrowth over an insulator material as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as further RF devices, power amplifiers (PAs), power management devices, antennas, arrays, sensors, and microelectromechanical systems (MEMS) devices may also be formed on the interposer 2304. In some embodiments, the IC structures implementing one or more Si-based devices integrated with one or more non-Si technology devices by semiconductor regrowth over an insulator material as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 8:
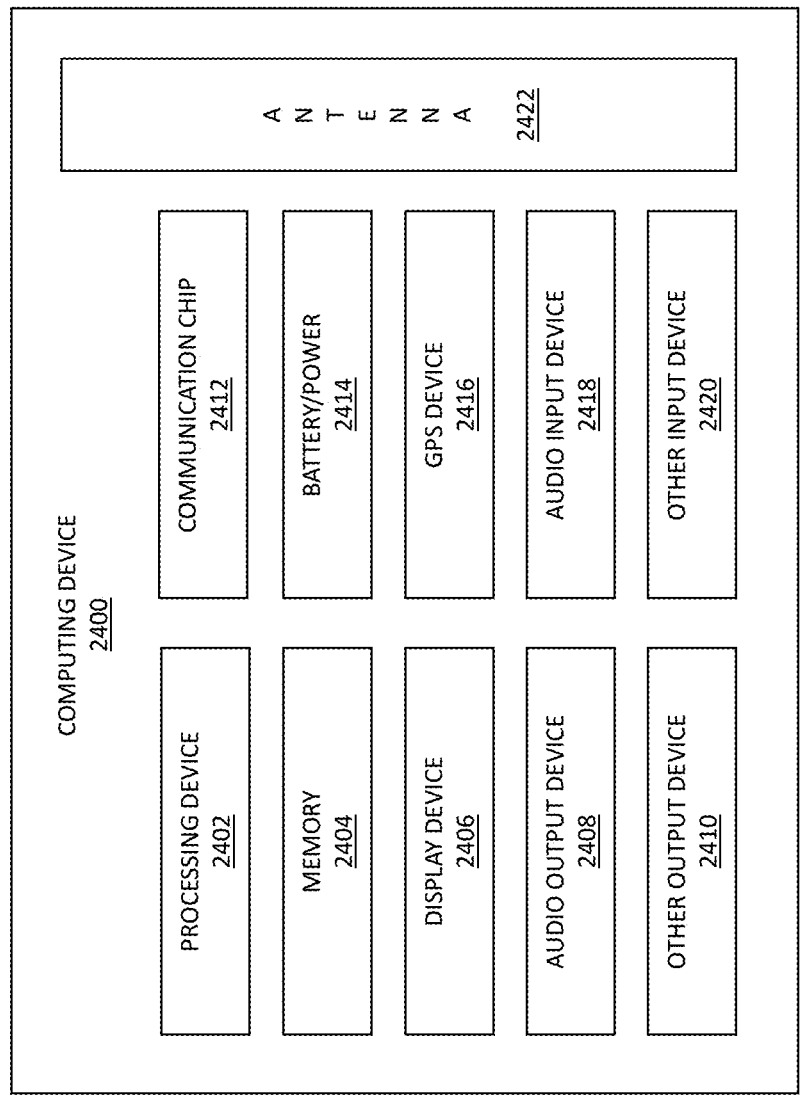
FIG. 8 is a block diagram of an example computing device that may include one or more IC structures having one or more Si-based devices integrated with one or more non-Si technology devices by semiconductor regrowth over an insulator material in accordance with any of the embodiments of the present disclosure.

FIG. 8 is a block diagram of an example computing device 2400 that may include one or more components with one or more IC structures having one or more Si-based devices integrated with one or more non-Si devices by semiconductor regrowth over an insulator material in accordance with any of the embodiments disclosed herein. For example, any suitable ones of the components of the computing device 2400 may include a die (e.g., the die 2002 (FIG. 5B)) including at least one Si-based device fabricated using semiconductor regrowth over an insulator material in accordance with any of the embodiments disclosed herein. Any of the components of the computing device 2400 may include an IC device (e.g., any embodiment of the IC structure of FIGS. 1-2) and/or an IC package 2200 (FIG. 6). Any of the components of the computing device 2400 may include an IC device assembly 2300 (FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC structures as described herein may be particularly advantageous for use within the one or more communication chips 2412, described above. For example, such IC structures, in particular one or more Si-based devices integrated with one or more non-Si technology devices by semiconductor regrowth over an insulator material as described herein, may be used to implement one or more of RF switches, PAs, low-noise amplifiers (LNAs), filters (including arrays of filters and filter banks), upconverters, downconverters, and duplexers, e.g., as a part of implementing the communication chips 2412.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 9:
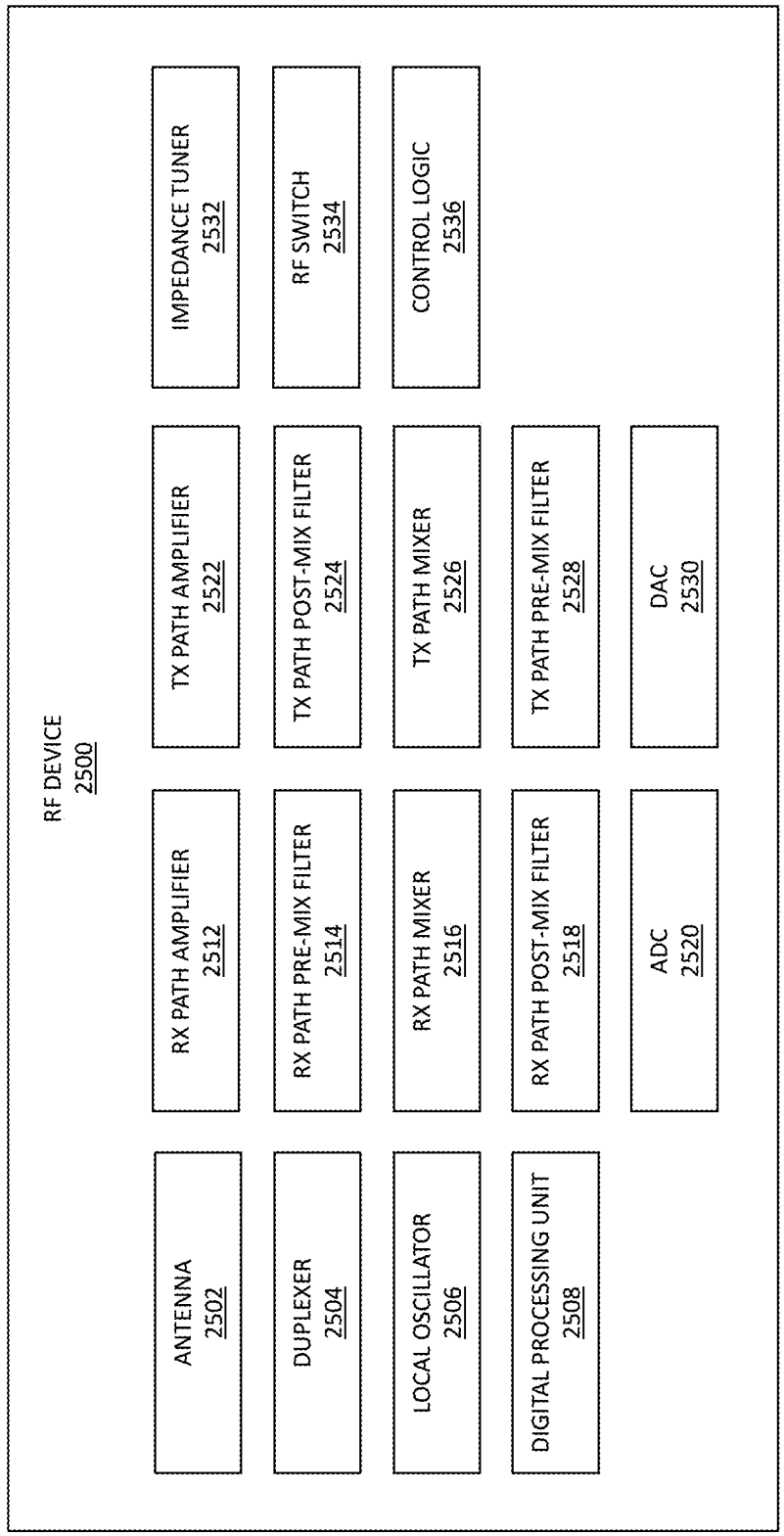
FIG. 9 is a block diagram of an example RF device that may include one or more IC structures having one or more Si-based devices integrated with one or more non-Si technology devices by semiconductor regrowth over an insulator material in accordance with any of the embodiments of the present disclosure.

FIG. 9 is a block diagram of an example RF device 2500 that may include one or more components with one or more IC structures having one or more Si-based devices integrated with one or more non-Si devices by semiconductor regrowth over an insulator material in accordance with any of the embodiments disclosed herein. For example, any suitable ones of the components of the RF device 2500 may include a die (e.g., the die 2002 as described with reference to FIG.

5 or a die implementing the IC structure as described with reference to FIG. 1 or 2) including at least one Si-based devices fabricated using semiconductor regrowth over an insulator material in accordance with any of the embodiments disclosed herein. Any of the components of the RF device 2500 may include an IC device (e.g., the IC structure of FIGS. 1-2) and/or an IC package 2200 as described with reference to FIG. 6. Any of the components of the RF device 2500 may include an IC device assembly 2300 as described with reference to FIG. 7. In some embodiments, the RF device 2500 may be included within any components of the computing device 2400 as described with reference to FIG. 8, or may be coupled to any of the components of the computing device 2400, e.g., be coupled to the memory 2404 and/or to the processing device 2402 of the computing device 2400. In still other embodiments, the RF device 2500 may further include any of the components described with reference to FIG. 8, such as, but not limited to, the battery/power circuit 2414, the memory 2404, and various input and output devices as shown in FIG. 8.

In general, the RF device 2500 may be any device or system that may support wireless transmission and/or reception of signals in the form of electromagnetic waves in the RF range of approximately 3 kiloHertz (kHz) to 300 gigaHertz (GHz). In some embodiments, the RF device 2500 may be used for wireless communications, e.g., in a BS or a UE device of any suitable cellular wireless communications technology, such as GSM, WCDMA, or LTE. In a further example, the RF device 2500 may be used as, or in, e.g., a BS or a UE device of a mm-wave wireless technology such as fifth generation (5G) wireless (i.e., high-frequency/short wavelength spectrum, e.g., with frequencies in the range between about 20 and 60 GHz, corresponding to wavelengths in the range between about 5 and 15 millimeters). In yet another example, the RF device 2500 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2500 may be used for wireless communications using Bluetooth technology (e.g., a frequency band from about 2.4 to about 2.485 GHz, corresponding to a wavelength of about 12 cm). In other embodiments, the RF device 2500 may be used for transmitting and/or receiving RF signals for purposes other than communication, e.g., in an automotive radar system, or in medical applications such as magneto-resonance imaging (MRI).

In various embodiments, the RF device 2500 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 9 as included in the RF device 2500, but any one or more of these components may be omitted or duplicated, as suitable for the application. For example, in some embodiments, the RF device 2500 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2500 may be an RF device supporting only wireless reception (e.g., an RF receiver), in which case it may include the components of the RX path, but not the components of the TX path; or the RF device 2500 may be an RF device supporting only wireless transmission (e.g., an RF transmitter), in which case it may include the components of the TX path, but not the components of the RX path.

In some embodiments, some or all of the components included in the RF device 2500 may be attached to one or more motherboards. In some embodiments, some or all of these components are fabricated on a single die, e.g., on a single SoC die.

Additionally, in various embodiments, the RF device 2500 may not include one or more of the components illustrated in FIG. 9, but the RF device 2500 may include interface circuitry for coupling to the one or more components. For example, the RF device 2500 may not include an antenna 2502, but may include antenna interface circuitry (e.g., a matching circuitry, a connector and driver circuitry) to which an antenna 2502 may be coupled. In another set of examples, the RF device 2500 may not include a digital processing unit 2508 or a local oscillator 2506, but may include device interface circuitry (e.g., connectors and supporting circuitry) to which a digital processing unit 2508 or a local oscillator 2506 may be coupled.

As shown in FIG. 9, the RF device 2500 may include an antenna 2502, a duplexer 2504, a local oscillator 2506, a digital processing unit 2508. As also shown in FIG. 9, the RF device 2500 may include an RX path that may include an RX path amplifier 2512, an RX path pre-mix filter 2514, a RX path mixer 2516, an RX path post-mix filter 2518, and an analog-to-digital converter (ADC) 2520. As further shown in FIG. 9, the RF device 2500 may include a TX path that may include a TX path amplifier 2522, a TX path post-mix filter 2524, a TX path mixer 2526, a TX path pre-mix filter 2528, and a digital-to-analog converter (DAC) 2530. Still further, the RF device 2500 may further include an impedance tuner 2532, an RF switch 2534, and control logic 2536. In various embodiments, the RF device 2500 may include multiple instances of any of the components shown in FIG. 9. In some embodiments, the RX path amplifier 2512, the TX path amplifier 2522, the duplexer 2504, and the RF switch 2534 may be considered to form, or be a part of, an RF FE of the RF device 2500. In some embodiments, the RX path amplifier 2512, the TX path amplifier 2522, the duplexer 2504, and the RF switch 2534 may be considered to form, or be a part of, an RF FE of the RF device 2500. In some embodiments, the RX path mixer 2516 and the TX path mixer 2526 (possibly with their associated pre-mix and post-mix filters shown in FIG. 9) may be considered to form, or be a part of, an RF transceiver of the RF device 2500 (or of an RF receiver or an RF transmitter if only RX path or TX path components, respectively, are included in the RF device 2500). In some embodiments, the RF device 2500 may further include one or more control logic elements/circuits, shown in FIG. 9 as control logic 2536, e.g., an RF FE control interface. The control logic 2536 may be used to, e.g., enhance control of complex RF system environment, support implementation of envelope tracking techniques, reduce dissipated power, etc. Various IC structures as described herein may be particularly advantageous for realizing at least portions of such control logic elements/circuits.

The antenna 2502 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2500 is an FDD transceiver, the antenna 2502 may be configured for concurrent reception and transmission of communication signals in separate, i.e., non-overlapping and non-continuous, bands of frequencies, e.g., in bands having a separation of, e.g., 20 MHz from one another. If the RF device 2500 is a TDD transceiver, the antenna 2502 may be configured for sequential reception and transmission of communication signals in bands of frequencies that may be the same, or overlapping for TX and RX paths. In some embodiments, the RF device 2500 may be a multi-band RF device, in which case the antenna 2502 may be configured for concurrent reception of signals having multiple RF components in separate frequency bands and/or configured for concurrent transmission of signals having multiple RF components in separate frequency bands. In such embodiments, the antenna 2502 may be a single wide-band antenna or a plurality of band-specific antennas (i.e., a plurality of antennas each configured to receive and/or transmit signals in a specific band of frequencies). In various embodiments, the antenna 2502 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2500 may include more than one antenna 2502 to implement antenna diversity. In some such embodiments, the RF switch 2534 may be deployed to switch between different antennas. Any of the embodiments of the IC structures with one or more Si-based devices integrated with one or more non-Si technology devices by semiconductor regrowth over an insulator material may be used to implement at least a portion of the RF switch 2534.

An output of the antenna 2502 may be coupled to the input of the duplexer 2504. The duplexer 2504 may be any suitable component configured for filtering multiple signals to allow for bidirectional communication over a single path between the duplexer 2504 and the antenna 2502. The duplexer 2504 may be configured for providing RX signals to the RX path of the RF device 2500 and for receiving TX signals from the TX path of the RF device 2500.

The RF device 2500 may include one or more local oscillators 2506, configured to provide local oscillator signals that may be used for downconversion of the RF signals received by the antenna 2502 and/or upconversion of the signals to be transmitted by the antenna 2502.

The RF device 2500 may include the digital processing unit 2508, which may include one or more processing devices. In some embodiments, the digital processing unit 2508 may be implemented as the processing device 2402 shown in FIG. 8, descriptions of which are provided above (when used as the digital processing unit 2508, the processing device 2402 may, but does not have to, implement any of the IC structures as described herein, e.g., IC structures having one or more Si-based devices integrated with one or more non-Si technology devices by semiconductor regrowth over an insulator material in accordance with any of the embodiments disclosed herein). The digital processing unit 2508 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 9, in some embodiments, the RF device 2500 may further include a memory device, e.g., the memory device 2404 as described with reference to FIG. 8, configured to cooperate with the digital processing unit 2508. When used within, or coupled to, the RF device 2500, the memory device 2404 may, but does not have to, implement any of the IC structures as described herein, e.g., IC structures having one or more Si-based devices integrated with one or more non-Si technology devices by semiconductor regrowth over an insulator material in accordance with any of the embodiments disclosed herein.

Turning to the details of the RX path that may be included in the RF device 2500, the RX path amplifier 2512 may include an LNA. An input of the RX path amplifier 2512 may be coupled to an antenna port (not shown) of the antenna 2502, e.g., via the duplexer 2504. The RX path amplifier 2512 may amplify the RF signals received by the antenna 2502.

An output of the RX path amplifier 2512 may be coupled to an input of the RX path pre-mix filter 2514, which may be a harmonic or band-pass (e.g., low-pass) filter, configured to filter received RF signals that have been amplified by the RX path amplifier 2512.

An output of the RX path pre-mix filter 2514 may be coupled to an input of the RX path mixer 2516, also referred to as a downconverter. The RX path mixer 2516 may include two inputs and one output. A first input may be configured to receive the RX signals, which may be current signals, indicative of the signals received by the antenna 2502 (e.g., the first input may receive the output of the RX path pre-mix filter 2514). A second input may be configured to receive local oscillator signals from one of the local oscillators 2506. The RX path mixer 2516 may then mix the signals received at its two inputs to generate a downconverted RX signal, provided at an output of the RX path mixer 2516. As used herein, downconversion refers to a process of mixing a received RF signal with a local oscillator signal to generate a signal of a lower frequency. In particular, the TX path mixer (e.g., downconverter) 2516 may be configured to generate the sum and/or the difference frequency at the output port when two input frequencies are provided at the two input ports. In some embodiments, the RF device 2500 may implement a direct-conversion receiver (DCR), also known as homodyne, synchrodyne, or zero-IF receiver, in which case the RX path mixer 2516 may be configured to demodulate the incoming radio signals using local oscillator signals whose frequency is identical to, or very close to the carrier frequency of the radio signal. In other embodiments, the RF device 2500 may make use of downconversion to an intermediate frequency (IF). IFs may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2516 may include several such stages of IF conversion.

Although a single RX path mixer 2516 is shown in the RX path of FIG. 9, in some embodiments, the RX path mixer 2516 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2502 and an in-phase component of the local oscillator signal provided by the local oscillator 2506. The second RX path mixer may be configured for performing downconversion to generate a quadrature (Q) downconverted RX signal by mixing the RX signal received by the antenna 2502 and a quadrature component of the local oscillator signal provided by the local oscillator 2506 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2516 may, optionally, be coupled to the RX path post-mix filter 2518, which may be low-pass filters. In case the RX path mixer 2516 is a quadrature mixer that implements the first and second mixers as described above, the in-phase and quadrature components provided at the outputs of the first and second mixers respectively may be coupled to respective individual first and second RX path post-mix filters included in the filter 2518.

The ADC 2520 may be configured to convert the mixed RX signals from the RX path mixer 2516 from analog to digital domain. The ADC 2520 may be a quadrature ADC that, similar to the RX path quadrature mixer 2516, may include two ADCs, configured to digitize the downconverted RX path signals separated in in-phase and quadrature components. The output of the ADC 2520 may be provided to the digital processing unit 2508, configured to perform various functions related to digital processing of the RX signals so that information encoded in the RX signals can be extracted.

Turning to the details of the TX path that may be included in the RF device 2500, the digital signal to later be transmitted (TX signal) by the antenna 2502 may be provided, from the digital processing unit 2508, to the DAC 2530. Similar to the ADC 2520, the DAC 2530 may include two DACs, configured to convert, respectively, digital I- and Q-path TX signal components to analog form.

Optionally, the output of the DAC 2530 may be coupled to the TX path pre-mix filter 2528, which may be a band-pass (e.g., low-pass) filter (or a pair of band-pass, e.g., low-pass, filters, in case of quadrature processing) configured to filter out, from the analog TX signals output by the DAC 2530, the signal components outside of the desired band. The digital TX signals may then be provided to the TX path mixer 2526, which may also be referred to as an upconverter. Similar to the RX path mixer 2516, the TX path mixer 2526 may include a pair of TX path mixers, for in-phase and quadrature component mixing. Similar to the first and second RX path mixers that may be included in the RX path, each of the TX path mixers of the TX path mixer 2526 may include two inputs and one output. A first input may receive the TX signal components, converted to the analog form by the respective DAC 2530, which are to be upconverted to generate RF signals to be transmitted. The first TX path mixer may generate an in-phase (I) upconverted signal by mixing the TX signal component converted to analog form by the DAC 2530 with the in-phase component of the TX path local oscillator signal provided from the local oscillator 2506 (in various embodiments, the local oscillator 2506 may include a plurality of different local oscillators, or be configured to provide different local oscillator frequencies for the mixer 2516 in the RX path and the mixer 2526 in the TX path). The second TX path mixer may generate a quadrature phase (Q) upconverted signal by mixing the TX signal component converted to analog form by the DAC 2530 with the quadrature component of the TX path local oscillator signal. The output of the second TX path mixer may be added to the output of the first TX path mixer to create a real RF signal. A second input of each of the TX path mixers may be coupled the local oscillator 2506.

Optionally, the RF device 2500 may include the TX path post-mix filter 2524, configured to filter the output of the TX path mixer 2526.

The TX path amplifier 2522 may be a PA, configured to amplify the upconverted RF signal before providing it to the antenna 2502 for transmission. Any of the embodiments of the IC structures with one or more Si-based devices integrated with one or more non-Si technology devices by semiconductor regrowth over an insulator material may be used to implement the TX path amplifier 2522 as a PA.

In various embodiments, any of the RX path pre-mix filter 2514, the RX path post-mix filter 2518, the TX post-mix filter 2524, and the TX pre-mix filter 2528 may be implemented as RF filters. In some embodiments, each of such RF filters may include one or more, typically a plurality of, resonators (e.g., film bulk acoustic resonators (FBARs), Lamb wave resonators, and/or contour-wave resonators), arranged, e.g., in a ladder configuration. An individual resonator of an RF filter may include a layer of a piezoelectric material such as AlN, enclosed between a bottom electrode and a top electrode, with a cavity provided around a portion of each electrode in order to allow a portion of the piezoelectric material to vibrate during operation of the filter. In some embodiments, an RF filter may be implemented as a plurality of RF filters, or a filter bank. A filter bank may include a plurality of RF resonators that may be coupled to a switch, e.g., the RF switch 2534, configured to selectively switch any one of the plurality of RF resonators on and off (i.e., activate any one of the plurality of RF resonators), in order to achieve desired filtering characteristics of the filter bank (i.e., in order to program the filter bank). For example, such a filter bank may be used to switch between different RF frequency ranges when the RF device 2500 is, or is included in, a BS or in a UE device. In another example, such a filter bank may be programmable to suppress TX leakage on the different duplex distances.

The impedance tuner 2532 may include any suitable circuitry, configured to match the input and output impedances of the different RF circuitries to minimize signal losses in the RF device 2500. For example, the impedance tuner 2532 may include an antenna impedance tuner. Being able to tune the impedance of the antenna 2502 may be particularly advantageous because antenna's impedance is a function of the environment that the RF device 2500 is in, e.g., antenna's impedance changes depending on, e.g., if the antenna is held in a hand, placed on a car roof, etc.

As described above, the RF switch 2534 may be used to selectively switch between a plurality of instances of any one of the components shown in FIG. 9, in order to achieve desired behavior and characteristics of the RF device 2500. For example, in some embodiments, an RF switch may be used to switch between different antennas 2502. In other embodiments, an RF switch may be used to switch between a plurality of RF resonators (e.g., by selectively switching RF resonators on and off) of any of the filters included in the RF device 2500.

In various embodiments, one or more Si-based devices integrated with one or more non-Si technology devices by semiconductor regrowth over an insulator material as described herein may be particularly advantageous when used in, or to provide an RF interconnect to (i.e., to provide means for supporting communication of RF signals to), any of the duplexer 2504, RX path amplifier 2512, RX path pre-mix filter 2514, RX path post-mix filter 2518, TX path amplifier 2522, TX path pre-mix filter 2528, TX path post-mix filter 2524, impedance tuner 2532, and/or RF switch 2534. In various embodiments, one or more Si-based devices integrated with one or more non-Si technology devices by semiconductor regrowth over an insulator material as described herein may enable more energy efficient CMOS implementations of circuits, e.g., to name a few, control logic circuitries, current mirrors, power gating circuitries, memory elements etc.

The RF device 2500 provides a simplified version and, in further embodiments, other components not specifically shown in FIG. 9 may be included. For example, the RX path of the RF device 2500 may include a current-to-voltage amplifier between the RX path mixer 2516 and the ADC 2520, which may be configured to amplify and convert the downconverted signals to voltage signals. In another example, the RX path of the RF device 2500 may include a balun transformer for generating balanced signals. In yet another example, the RF device 2500 may further include a clock generator, which may, e.g., include a suitable phased-lock loop (PLL), configured to receive a reference clock signal and use it to generate a different clock signal that may then be used for timing the operation of the ADC 2520, the DAC 2530, and/or that may also be used by the local oscillator 2506 to generate the local oscillator signals to be used in the RX path or the TX path.

Select Examples

The following paragraphs provide various examples of the embodiments disclosed herein.

Example 1 provides an IC structure that includes a support structure (e.g., a substrate, a die, or a chip); a first semiconductor material provided over the support structure; an insulator material; and a Si-based semiconductor material stack that includes a second semiconductor material and a third semiconductor material. In such an IC structure, the second semiconductor material includes polycrystalline silicon and is between the insulator material and the third semiconductor material, the insulator material is between the first semiconductor material and the second semiconductor material, e.g., with one face of the second semiconductor material being in contact with the insulator material and another face of the second semiconductor material being in contact with the third semiconductor material, and at least 85% of the third semiconductor material (e.g., at least 90% or at least 95%) is monocrystalline.

Example 2 provides the IC structure according to example 1, further including a transistor having a channel material, where the channel material of the transistor includes at least a portion of the third semiconductor material.

Example 3 provides the IC structure according to example 2, where the transistor further includes a pair of S/D regions, and each of the pair of S/D regions includes a doped semiconductor material. For example, in some embodiments, the doped semiconductor material may have a dopant concentration of at least $1\times10^{18}$ cm$^{-3}$, e.g., of at least $1\times10^{20}$ cm$^{-3}$ or of at least $1\times10^{21}$ cm$^{-3}$.

Example 4 provides the IC structure according to example 3, where a lattice constant of the doped semiconductor material of at least one of the pair of S/D regions is different from a lattice constant of the third semiconductor material, e.g. different by at least 2%, e.g. by at least 5% or by at least 10%.

Example 5 provides the IC structure according to examples 3 or 4, where the lattice constant of the doped semiconductor material is larger than the lattice constant of the third semiconductor material. In such a case, compressive strain may be induced in the third semiconductor material, which may be particularly advantageous in terms of carrier mobility in the channel material if the transistor is a PMOS transistor.

Example 6 provides the IC structure according to example 5, where the third semiconductor material includes silicon and the doped semiconductor material includes silicon germanium.

Example 7 provides the IC structure according to examples 5 or 6, where a percentage amount of germanium in the doped semiconductor material is greater than a percentage amount of germanium in the third semiconductor material. For example, in some embodiments, the doped semiconductor material may be substantially 100% germanium, while the third semiconductor material may be $Si_xGe_{1-x}$, where x is greater than zero. In other embodiments, both the doped semiconductor material and the third semiconductor material may include silicon germanium, but the doped semiconductor material would have a higher percentage of germanium (in terms of stoichiometric relationship of germanium to silicon) than the third semiconductor material, resulting in the lattice constant of the doped semiconductor material being larger than that of the third semiconductor material.

Example 8 provides the IC structure according to any one of examples 5-7, where the dopant atoms of the doped semiconductor materials are P-type dopant atoms, e.g., boron atoms (i.e., the transistor is a PMOS transistor). In such embodiments, the channel material of the transistor may include the third semiconductor material doped with N-type dopant atoms, e.g., phosphorous or arsenic atoms, e.g., in dopant concentrations between about $1\times10^{17}$ cm$^{-3}$ and $1\times10^{20}$ cm$^{-3}$, including all values and ranges therein.

Example 9 provides the IC structure according to examples 3 or 4, where the lattice constant of the doped semiconductor material is smaller than the lattice constant of the third semiconductor material. In such a case, tensile strain may be induced in the third semiconductor material, which may be particularly advantageous in terms of carrier mobility in the channel material if the transistor is an NMOS transistor.

Example 10 provides the IC structure according to example 9, where the third semiconductor material includes silicon germanium and the doped semiconductor material includes silicon.

Example 11 provides the IC structure according to examples 9 or 10, where a percentage amount of silicon in the doped semiconductor material is greater than a percentage amount of silicon in the third semiconductor material. For example, in some embodiments, the doped semiconductor material may be substantially 100% silicon, while the third semiconductor material may be $Si_xGe_{1-x}$, where x is less than or equal to 1. In other embodiments, both the doped semiconductor material and the third semiconductor material may include silicon germanium, but the doped semiconductor material would have a higher percentage of silicon (in terms of stoichiometric relationship of germanium to silicon) than the third semiconductor material, resulting in the lattice constant of the doped semiconductor material being smaller than that of the third semiconductor material.

Example 12 provides the IC structure according to any one of examples 9-11, where the dopant atoms of the doped semiconductor materials are N-type dopant atoms, e.g., phosphorous and/or arsenic atoms (i.e., the transistor is an NMOS transistor). In such embodiments, the channel material of the transistor may include the third semiconductor material doped with P-type dopant atoms, e.g., boron atoms, e.g., in dopant concentrations between about $1 \times 10^{17}$ cm$^{-3}$ and $1 \times 10^{20}$ cm$^{-3}$, including all values and ranges therein.

Example 13 provides an IC structure that includes a support structure (e.g., a substrate, a die, or a chip); a first semiconductor material provided over the support structure; an insulator material; a first transistor including a stack of a second semiconductor material and a third semiconductor material; and a second transistor including a stack of the second semiconductor material and a fourth semiconductor material. In such an IC structure, the second semiconductor material includes polycrystalline silicon and is between the insulator material and the third semiconductor material, a first portion of the insulator material is between the first semiconductor material and the stack of the first transistor, and a second portion of the insulator material is between the first semiconductor material and the stack of the second transistor.

Example 14 provides the IC structure according to example 13, where the first transistor is a P-type transistor and the second transistor is an N-type transistor.

Example 15 provides the IC structure according to examples 13 or 14, where the third semiconductor material includes silicon and the fourth semiconductor material includes germanium (e.g., silicon and germanium). In some embodiments, the first and second transistors may include semiconductor materials that include silicon and germanium in various compositions (e.g., in various stoichiometry).

Example 16 provides the IC structure according to any one of examples 13-15, where a gate of the first transistor is electrically coupled to a gate of the second transistor, which may be used to form, e.g., an inverter device.

Example 17 provides the IC structure according to any one of examples 13-15, where a source or a gate electrode of the first transistor is electrically coupled to a source or a gate electrode of the second transistor, which may be used to form, e.g., a cascode amplifier device.

Example 18 provides the IC structure according to any one of examples 13-17, where at least 85% of the third semiconductor material (e.g., at least 90% or at least 95%) is monocrystalline, and/or at least 85% of the fourth semiconductor material (e.g., at least 90% or at least 95%) is monocrystalline.

Example 19 provides the IC structure according to any one of the preceding examples, where the first semiconductor material includes one or more of a III-N semiconductor material, a II-IV semiconductor material, or a III-V semiconductor material.

Example 20 provides the IC structure according to any one of the preceding examples, where the third semiconductor material is an epitaxially grown semiconductor material.

Example 21 provides the IC structure according to any one of the preceding examples, where the third semiconductor material is in contact with the second semiconductor material.

Example 22 provides the IC structure according to any one of the preceding examples, where the second semiconductor material is in contact with the insulator material.

Example 23 provides a method of manufacturing an IC structure. The method includes providing a first semiconductor material over a support structure (e.g., a substrate, a die, or a chip); providing an insulator material over at least a portion of the first semiconductor material; providing a second semiconductor material over at least a portion of the insulator material, where the second semiconductor material includes polycrystalline silicon; and epitaxially growing a third semiconductor material over at least a portion of the second semiconductor material.

Example 24 provides the method according to example 23, further including performing an anneal after providing the second semiconductor material and before epitaxially growing the third semiconductor material.

Example 25 provides the method according to example 24, where performing the anneal includes placing the IC structure in an environment having a temperature of at least about 400 degrees Celsius for a time period of at least about 10 seconds, including all values and ranges therein (e.g., for a time period of at least 2 minutes, or for a time period of at least 5 minutes).

Example 26 provides the method according to any one of examples 23-25, where providing the second semiconductor material includes depositing the second semiconductor material using CVD.

In further examples, the method according to any one of examples 23-26 may further include processes to manufacture the IC structure according to any one of the preceding examples (e.g., any one of examples 1-22).

In yet further examples, the method according to any one of examples 23-26 may further include providing at least source and drain regions for a first transistor in the first semiconductor material before depositing the second semiconductor material so that a portion of the first semiconductor material forms a channel material of the first transistor; and providing at least source and drain regions for a second transistor in the third semiconductor material so that a portion of the third semiconductor material forms a channel material of the second transistor.

In another further example, at least one of the first transistor and the second transistor is a finFET.

Example 27 provides an IC package that includes an IC die, the IC die including the IC structure according to any one of the preceding examples (e.g., any one of examples 1-22), and a further IC component, coupled to the IC die.

Example 28 provides the IC package according to example 27, where the further IC component includes one of a package substrate, an interposer, or a further IC die.

Example 29 provides the IC package according to any one of examples 27-28, where the IC package is included in a base station of a wireless communication system.

Example 30 provides the IC package according to any one of examples 27-28, where the IC package is included in a UE device (e.g., a mobile device) of a wireless communication system.

Example 31 provides the IC package according to any one of the preceding examples, where the IC die is a part of an RF device.

Example 32 provides an electronic device that includes a carrier substrate and an IC die coupled to the carrier substrate. The IC die includes the IC structure according to any one of examples 1-22, and/or is included in the IC package according to any one of examples 27-31.

Example 33 provides the electronic device according to example 32, where the computing device is a wearable or handheld electronic device.

Example 34 provides the electronic device according to examples 32 or 33, where the electronic device further includes one or more communication chips and an antenna.

Example 35 provides the electronic device according to any one of examples 32-34, where the carrier substrate is a motherboard.

Example 36 provides the electronic device according to any one of examples 32-35, where the electronic device is an RF transceiver.

Example 37 provides the electronic device according to any one of examples 32-36, where the electronic device is one of an RF switch, a power amplifier, a low-noise amplifier, a filter, a filter bank, a duplexer, an upconverter, or a downconverter of an RF communications device, e.g., of an RF transceiver.

Example 38 provides the electronic device according to any one of examples 32-37, where the electronic device is included in a base station of a wireless communication system.

Example 39 provides the electronic device according to any one of examples 32-37, where the electronic device is included in a UE device (e.g., a mobile device) of a wireless communication system.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising:
   a substrate;
   a first transistor and a second transistor over the substrate;
   a first semiconductor material, wherein the first semiconductor material is a III-N semiconductor material and wherein a portion of the first semiconductor material is a channel region of the first transistor;
   an insulator material;
   a second semiconductor material; and
   a third semiconductor material,
   wherein:
      the second semiconductor material includes polycrystalline silicon and is between the insulator material and the third semiconductor material,
      along a line perpendicular to the substrate the insulator material is between the first semiconductor material and the second semiconductor material, and
      at least 85% of the third semiconductor material is monocrystalline and a portion of the third semiconductor material is a channel region of the second transistor.

2. The IC structure according to claim 1, wherein:
   the second transistor further includes a source region and a drain region, and
   each of the source region and the drain region includes a doped semiconductor material.

3. The IC structure according to claim 2, wherein a lattice constant of the doped semiconductor material of at least one of the source region or the drain region is different from a lattice constant of the third semiconductor material.

4. The IC structure according to claim 2, wherein a lattice constant of the doped semiconductor material is larger than a lattice constant of the third semiconductor material.

5. The IC structure according to claim 4, wherein the third semiconductor material includes silicon and the doped semiconductor material includes silicon germanium.

6. The IC structure according to claim 4, wherein a percentage amount of germanium in the doped semiconductor material is greater than a percentage amount of germanium in the third semiconductor material.

7. The IC structure according to claim 2, wherein a lattice constant of the doped semiconductor material is smaller than a lattice constant of the third semiconductor material.

8. The IC structure according to claim 7, wherein the third semiconductor material includes silicon germanium and the doped semiconductor material includes silicon.

9. An integrated circuit (IC) structure, comprising:
   a first semiconductor material, wherein the first semiconductor material is a III-N semiconductor material;
   a hard-mask material over the first semiconductor material;
   an insulator material over the hard-mask material;
   a first transistor comprising a stack of a second semiconductor material and a third semiconductor material;
   a second transistor comprising a stack of the second semiconductor material and a fourth semiconductor material,
   wherein:
      the second semiconductor material includes polycrystalline silicon and is between the insulator material and the third semiconductor material,
      a first portion of the insulator material is between the first semiconductor material and the stack of the first transistor, and is in contact with the hard-mask material and the second semiconductor material of the stack of the first transistor, and
      a second portion of the insulator material is between the first semiconductor material and the stack of the second transistor, and is in contact with the hard-mask material and the second semiconductor material of the stack of the second transistor.

10. The IC structure according to claim 9, wherein the first transistor is a P-type transistor and the second transistor is an N-type transistor.

11. The IC structure according to claim 9, wherein the third semiconductor material includes silicon and the fourth semiconductor material includes germanium.

12. The IC structure according to claim 9, wherein a gate of the first transistor is electrically coupled to a gate of the second transistor.

13. The IC structure according to claim 9, wherein a source or a gate electrode of the first transistor is electrically coupled to a source or a gate electrode of the second transistor.

14. The IC structure according to claim 9, wherein:
   at least 85% of the third semiconductor material is monocrystalline, and/or
   at least 85% of the fourth semiconductor material is monocrystalline.

15. The IC structure according to claim 9, wherein the first semiconductor material includes one or more of:
- a III-N semiconductor material,
- a II-VI semiconductor material, or
- a III-V semiconductor material.

16. The IC structure according to claim 9, wherein:
the third semiconductor material is in contact with the second semiconductor material of the stack of the first transistor, and
the fourth semiconductor material is in contact with the second semiconductor material of the stack of the second transistor.

17. The IC structure according to claim 9, further comprising a third transistor, wherein a channel region of the third transistor includes a portion of the first semiconductor material.

18. The IC structure according to claim 9, wherein:
the second semiconductor material of the stack of the first transistor and the second semiconductor material of the stack of the second transistor a portions of a materially continuous layer of the second semiconductor material, and
at least a portion of the third semiconductor material of the stack of the first transistor and a least a portion of the fourth semiconductor material of the stack of the second transistor are in a same plane parallel to the layer of the second semiconductor material.

19. An integrated circuit (IC) structure, comprising:
a first semiconductor material, wherein the first semiconductor material is a III-N semiconductor material;
an insulator material;
a first transistor comprising a stack of a second semiconductor material and a third semiconductor material;
a second transistor comprising a stack of the second semiconductor material and a fourth semiconductor material,
wherein:
the second semiconductor material includes polycrystalline silicon and is between the insulator material and the third semiconductor material,
a first portion of the insulator material is between the first semiconductor material and the stack of the first transistor, and is in contact with the second semiconductor material of the stack of the first transistor,
a second portion of the insulator material is between the first semiconductor material and the stack of the second transistor, and is in contact with the second semiconductor material of the stack of the second transistor,
the second semiconductor material of the stack of the first transistor and the second semiconductor material of the stack of the second transistor a portions of a materially continuous layer of the second semiconductor material, and
at least a portion of the third semiconductor material of the stack of the first transistor and a least a portion of the fourth semiconductor material of the stack of the second transistor are in a same plane parallel to the layer of the second semiconductor material.

20. The IC structure according to claim 19, further comprising a third transistor, wherein a channel region of the third transistor includes a portion of the first semiconductor material.

\* \* \* \* \*